(12) United States Patent
Lee

(10) Patent No.: US 11,769,809 B2
(45) Date of Patent: Sep. 26, 2023

(54) STRUCTURES OF GATE CONTACT FORMATION FOR VERTICAL TRANSISTORS

(71) Applicant: Sang-Yun Lee, Hillsboro, OR (US)

(72) Inventor: Sang-Yun Lee, Hillsboro, OR (US)

(73) Assignee: BESANG, INC., Hillsboro, OR (US)

( * ) Notice: Subject to any disclaimer, the term of this patent is extended or adjusted under 35 U.S.C. 154(b) by 0 days.

(21) Appl. No.: 17/083,026

(22) Filed: Oct. 28, 2020

(65) Prior Publication Data
US 2022/0130973 A1   Apr. 28, 2022

(51) Int. Cl.
| | |
|---|---|
| *H01L 29/78* | (2006.01) |
| *H01L 29/66* | (2006.01) |
| *H01L 29/792* | (2006.01) |
| *H10B 43/27* | (2023.01) |
| *H01L 29/423* | (2006.01) |
| *H01L 25/18* | (2023.01) |

(Continued)

(52) U.S. Cl.
CPC .......... *H01L 29/4234* (2013.01); *H01L 25/18* (2013.01); *H01L 29/0649* (2013.01); *H01L 29/401* (2013.01); *H01L 29/66666* (2013.01); *H01L 29/66833* (2013.01); *H01L 29/7827* (2013.01); *H01L 29/7926* (2013.01); *H10B 12/05* (2023.02); *H10B 12/31* (2023.02); *H10B 12/50* (2023.02); *H10B 43/27* (2023.02); *H10B 43/35* (2023.02); *H10B 43/40* (2023.02)

(58) Field of Classification Search
CPC .................. H01L 29/4234; H01L 25/18; H01L 27/10808; H01L 27/10873; H01L 27/10897; H01L 27/1157; H01L 27/11573; H01L 27/11582; H01L 29/0649; H01L 29/66666; H01L 29/66833; H01L 29/7827; H01L 29/7926; H01L 29/401; H01L 29/78642; H10B 12/05; H10B 12/31; H10B 12/50; H10B 43/27; H10B 43/35; H10B 43/40
See application file for complete search history.

(56) References Cited

U.S. PATENT DOCUMENTS

| | | | |
|---|---|---|---|
| 2011/0227141 A1* | 9/2011 | Jeong ................ | H01L 27/11578 257/324 |
| 2020/0227429 A1* | 7/2020 | Ji ........................ | H01L 29/7827 |

(Continued)

*Primary Examiner* — Shahed Ahmed
*Assistant Examiner* — Khatib A Rahman
(74) *Attorney, Agent, or Firm* — Jeong Y. Choi

(57) ABSTRACT

Structures and methods that facilitate the formation of gate contacts for vertical transistors constructed with semiconductor pillars and spacer-like gates are disclosed. In a first embodiment, a gate contact rests on an extended gate region, a piece of a gate film, patterned at a side of a vertical transistor at the bottom of the gate. In a second embodiment, an extended gate region is patterned on top of one or more vertical transistors, resulting in a modified transistor structure. In a third embodiment, a gate contact rests on a top surface of a gate merged between two closely spaced vertical transistors. Optional methods and the resultant intermediate structures are included in the first two embodiments in order to overcome the related topography and ease the photolithography. The third embodiment includes alternatives for isolating the gate contact from the semiconductor pillars or for isolating the affected semiconductor pillars from the substrate.

32 Claims, 16 Drawing Sheets

(51) Int. Cl.
*H01L 29/40* (2006.01)
*H01L 29/06* (2006.01)
*H10B 12/00* (2023.01)
*H10B 43/35* (2023.01)
*H10B 43/40* (2023.01)

(56) References Cited

U.S. PATENT DOCUMENTS

| | | | |
|---|---|---|---|
| 2020/0411528 A1* | 12/2020 | Sung | H01L 27/10858 |
| 2021/0020747 A1* | 1/2021 | Chen | H01L 29/78642 |
| 2021/0111257 A1* | 4/2021 | Jun | H01L 27/092 |
| 2022/0037504 A1* | 2/2022 | Sills | H01L 27/11507 |
| 2022/0059693 A1* | 2/2022 | Nakamura | H01L 29/41741 |
| 2022/0109070 A1* | 4/2022 | Ono | H01L 29/6659 |

\* cited by examiner

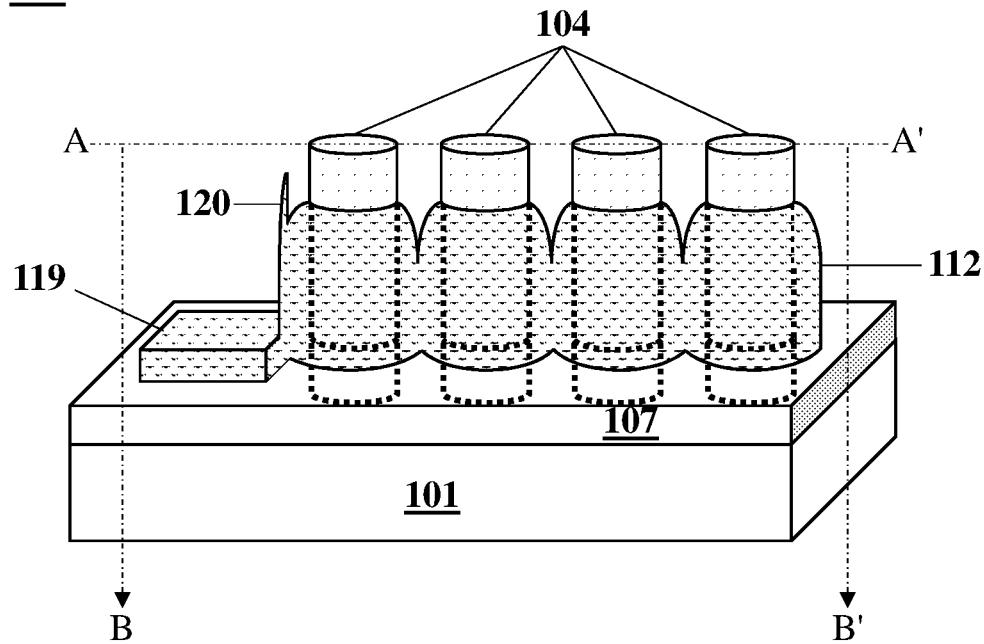
FIG. 1G (original)
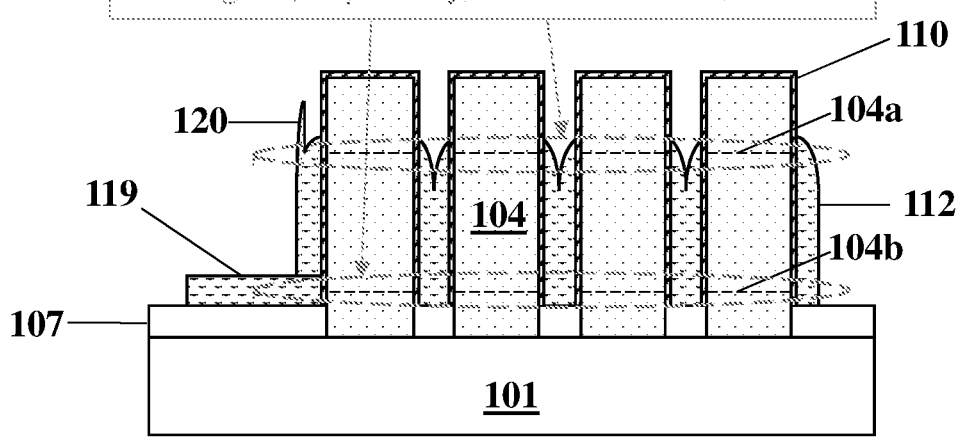
FIG. 1H (amended)

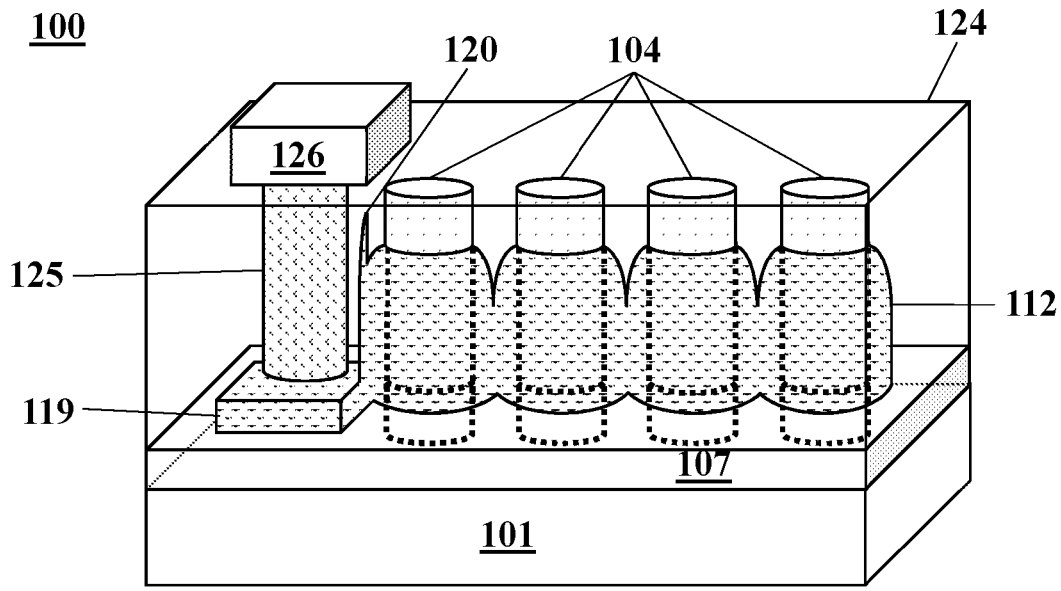
FIG. 1K (original)
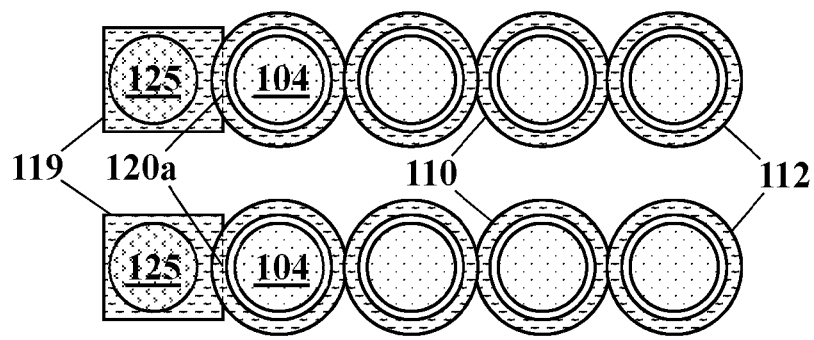
FIG. 1L (new)
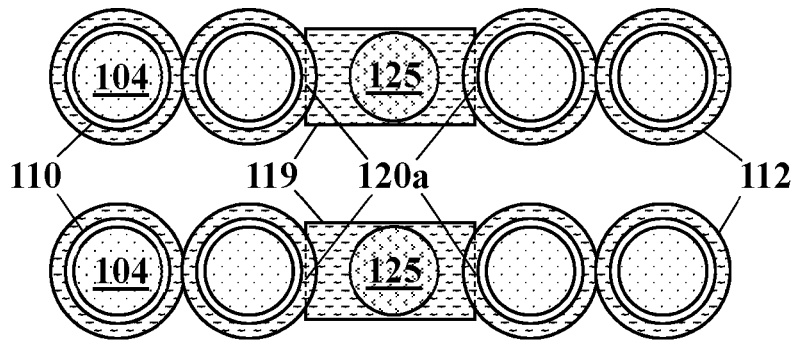
FIG. 1M (new)

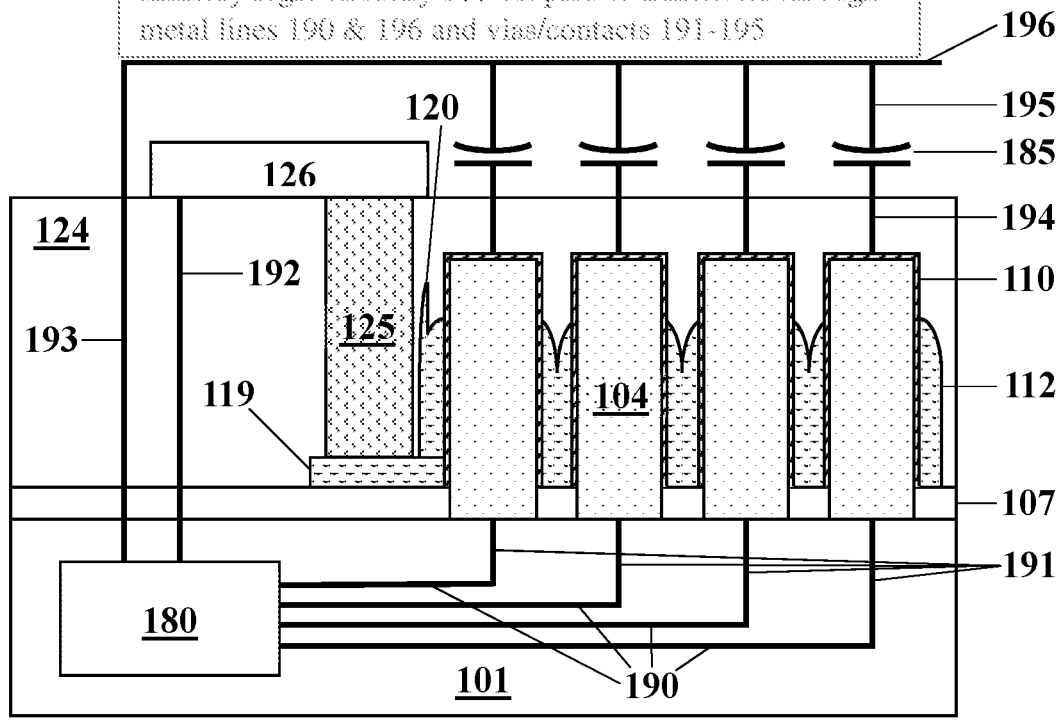
FIG. 1N (new)
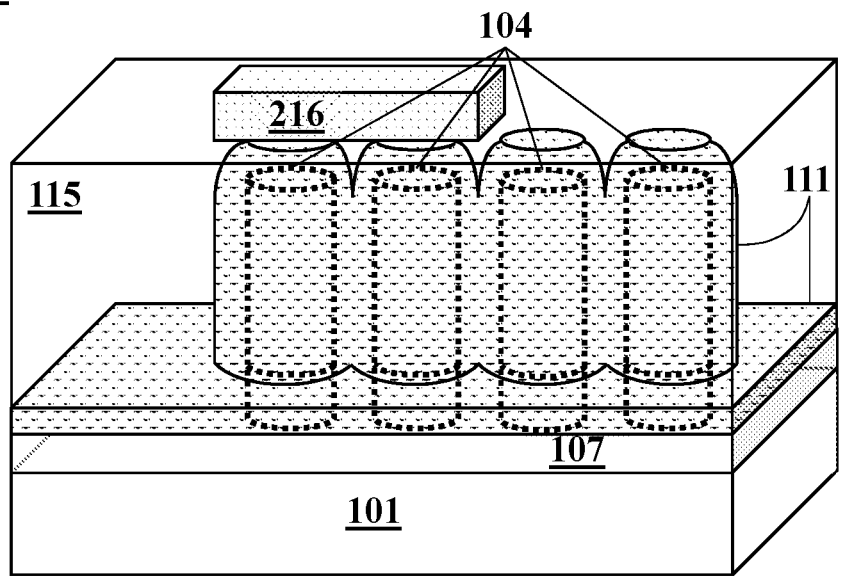
FIG. 2A (original)

300

300

300A

300B

STRUCTURES OF GATE CONTACT FORMATION FOR VERTICAL TRANSISTORS

TECHNICAL FIELD

The present disclosure relates generally to the technical field of semiconductor devices, more specifically structures and methods of vertically oriented transistors.

BACKGROUND

The memory density available in a single semiconductor chip has been increasing whether the memory serves as an on-chip or off-chip module. Various types of memories and logic circuits are incorporated into single chips for certain applications. These have reduced manufacturing costs of chips and systems for many applications, and improved capacity of data storage and bandwidth of data communication. Such results have been achieved as a result of developing semiconductor manufacturing technologies progressively to more advanced stages. Under the state-of-the-art technology, integrated circuits containing billions of semiconductor devices in a single chip are commonplace.

However, even such chips often fail to satisfy certain applications demanding very high memory densities, forcing systems to assemble numerous chips, thus implicating extremely high costs, rather than much reduced number of chips, thus costing much less. Further, the traditional planar structures for active semiconductor devices are posing a significant limit on the number of devices that can be integrated on a chip. To make the matter even worse, memory technologies are facing or have already faced scaling limits with the traditional planar device structures. For example, it is generally believed that NVM (nonvolatile memory) has struck a scaling limit at around 12 nm technology and DRAM (dynamic random access memory) scaling may barely stretch down to 12 nm technology.

These limitations faced with traditional device structures have led products in some applications to use vertically oriented devices, especially when requiring memories of very high densities. In vertically oriented devices, electrons and holes move in a direction perpendicular or nearly perpendicular to the horizontal surface of the substrate. To further increase the number of devices that can be packed into a chip, vertically oriented devices are often fabricated over other planar devices.

Vertical transistors (often referred to as "transistors" hereinafter), a type of vertically oriented devices, are constructed with tall semiconductor pillars (often referred to as "pillars" hereinafter) standing on (or over) a substrate. Unlike a planar MOSFET which has a gate above the channel, a vertical transistor has a gate vertically on the sidewall of a semiconductor pillar. Gates of vertical transistors are in general patterned by employing a self-aligned anisotropic etch with a sufficient over-etch to leave spacer-like pieces of gate film on portions of the sidewalls of the pillars. One skilled in the art would readily recognize that the orientation of the vertically formed gate, particularly the shape and horizontal dimension of the spacer-like gate, poses a tremendous challenge in the formation of gate contacts for the transistor.

SUMMARY

Novel structures of gate contact formation for vertical transistors are disclosed herein, together with methods for realizing the novel structures. According to a first embodiment of the present disclosure, a gate contact rests on an extended gate region, a piece of a gate film, patterned on a side of and continuous with the gate at a bottom edge. With such a planar landing pad, a gate contact can be made with no difficulty at all. The mask for patterning the gate film in the first embodiment may be formed on the gate film directly. There may be a challenge in photolithography associated with the topography created by tall pillars, which can be alleviated with certain design rules. The mask may alternatively be formed over a planarized dielectric layer disposed on the gate film. The alternative method of forming the mask does not pose any challenge in photolithography, even without an aid by a design rule, because the mask is formed on a planarized surface.

In a second embodiment of the present disclosure, the gate contact rests on an extended gate region patterned over the semiconductor pillar. This method utilizes a modified transistor structure which leaves the gate film over its pillar. The extended gate region thus formed offers a sufficient area for gate contact formation. The mask for patterning the gate film in the second embodiment may be formed directly on the gate film, optionally with at least a design rule to make the location of the mask more amenable to a photolithography process. Alternatively, the mask may be formed over a planarized dielectric layer disposed on the gate film, in which case no photolithography issue exists, even without an aid by a design rule. The extended gate region thus formed is continuous with the transistor gate, and a gate contact formed on the extended gate region serves to provide a gate bias to all transistors that are sufficiently closely spaced from immediate neighbors in a one-dimensional array.

In accordance with a third embodiment of the present disclosure, the gate contact rests on the top surface of the gate between two or more closely spaced semiconductor pillars. The semiconductor pillars are spaced at the minimum feature size of the technology, and the thickness of the gate is chosen to have a merged gate between the pillars. No additional masking step is required to leave a piece of gate film anywhere. The surface are of the merged gate would be more sufficient for gate contact formation than that of a single spacer-like gate. The gate contact may optionally be isolated from top portions of the two pillars by forming pillars with a hard mask and disposing a SAC (self-aligned contact) film over the entire structure before disposing a planarized pre-metal dielectric of different material through which the gate contact is disposed. The SAC film may be subjected to a blanket anisotropic etch before disposing the pre-metal dielectric, or may be etched as a second step during the gate contact etch. In an alternative, the two or more pillars are let shorted to the gate via the gate contact but selectively isolated from the substrate which would otherwise connect all pillars standing on it. Exemplary methods of such isolation are described.

This Summary is provided to introduce a selection of concepts in a simplified form that are further described below in Detailed Description. This Summary is not intended to identify key or essential features of the claimed subject matter, nor is it intended to be used as an aid in determining the scope of the claimed subject matter. Furthermore, the structures and methods disclosed herein may be implemented in any means and/or combinations for achieving various aspects of the present disclosure. Other features will be apparent from the accompanying drawings and from the detailed description that follows. Accordingly, the specification and drawings are to be regarded in an illustrative rather than a restrictive sense.

BRIEF DESCRIPTION OF THE DRAWINGS

Example embodiments are illustrated by way of example and not limitation in the figures of the accompanying drawings, in which like references indicate similar elements.

FIG. 1G is the structure of FIG. 1E changed after etching the gate film.

FIG. 1H is a cross-sectional view of the 3D drawing of FIG. 1G when cut vertically by line A-A'. Dashed lines 104a (or 104b) indicate the boundaries between channel regions and top regions (or bottom regions) of semiconductor pillars. The middle region (between 104a and 104b) has a doping type opposite to that of the top and bottom regions.

FIG. 1K shows how the structures of FIG. 1G or FIG. 1J changed after disposing a planarized pre-metal dielectric, forming a gate contact through the pre-metal dielectric, and patterning a metal over the contact and over the pre-metal dielectric.

FIG. 1L is a top view of a structure with a two-dimensional array of vertical transistors, employing that of FIG. 1K. Only the layers between dielectric film 107 and metal layer 126 are shown. Dashed lines 120a indicate one edge of a sharp gate piece 120. Note that the inter-row spacing is wider than intra-row spacing, so that transistors are separated at gate between rows but coupled at gate within rows.

FIG. 1M is a variation of the structure shown in FIG. 1L, having the extended gate regions in a middle position of rows of vertical transistors. Note that the edges of the sharp pieces of the gate material, as indicated by dashed lines 120a, are on both sides of the extended gate regions which couple vertical transistors along the same rows on both sides of the extended gate regions.

FIG. 1N is an embodiment of a DRAM shown with a cross-sectional view of transistors in FIG. 1K and with schematic representation of storage capacitors 185 and a memory logic circuitry 180. The couplings between the vertical transistors and other DRAM elements are accomplished through vias 191-195 and metal lines 190 & 196 at various levels, potentially involving multiple layers for each via or metal line.

FIG. 2A illustrates a structure in accordance with a second embodiment of the present disclosure after patterning a mask on an optional dielectric layer disposed on the gate film in a manner similar to FIG. 1I except for the position of the mask.

Figure 1A:
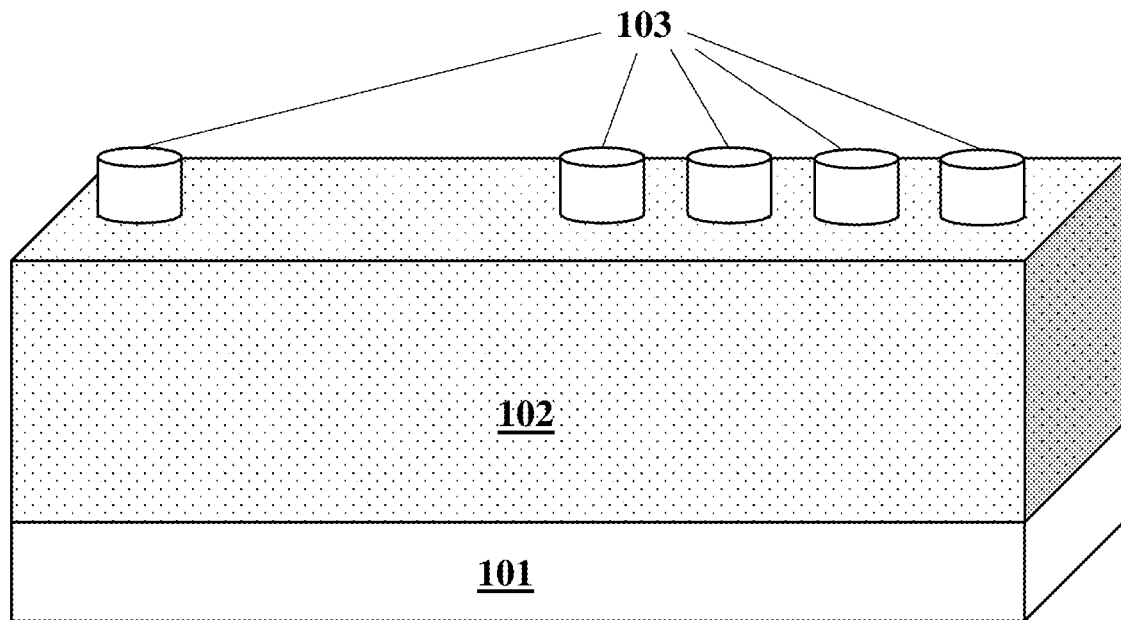
FIG. 1A illustrates a structure after a mask is formed on a semiconductor layer. It is at an early stage of an example of implementing vertical transistors in accordance with a first embodiment of the present disclosure.

The drawings referred to in this description should be understood as not being drawn to scale, except if specifically noted, in order to show more clearly the details of the present disclosure Like reference numbers in the drawings indicate like elements throughout the several views Like fill patterns in the drawings indicate like elements throughout the drawings, in the absence of like reference numbers. Other features and advantages of the present disclosure will be apparent from accompanying drawings and from the detailed description that follows.

DETAILED DESCRIPTION

Structures and methods for vertically oriented semiconductor transistors and arrays thereof are disclosed. In the following description, for the purposes of explanation, numerous specific details are set forth in order to provide a thorough understanding of the various embodiments. However, it will be evident that one skilled in the art may practice various embodiments within the scope of this disclosure without these specific details.

In this section, the pillars and transistors affected for the formation of gate contact are referred to as "pillars of interest" and "transistors of interest", respectively. For example, the transistor next or over which a gate contact is made is referred to as "transistor of interest". In the present disclosure, sizes and spaces between elements allowed in a technology are expressed in terms of multiples of the minimum feature size (F) of the technology, such as "1 F" for the minimum feature size or "1.5 F" for one-and-half times the minimum feature size.

FIGS. 1A-K illustrate structures and methods in accordance with a first embodiment of the present disclosure. An extended gate region, a piece of gate film, is patterned with a mask at the side of and slightly overlapping with the gate of a vertical transistor. The extended gate region thus formed protrudes outward from a bottom edge of the gate and provides a sufficient planar area to serve as a landing pad for the formation of a gate contact.

FIG. 1A shows a 3D perspective of a structure 100 of the first embodiment at an early stage of a manufacturing process. A semiconductor layer 102 is disposed over a substrate 101. The substrate may have a semiconductor, metal, or dielectric as a top layer, disposed over other structures. In some cases, the semiconductor layer may be an epitaxial layer grown on the substrate. Then, the substrate, or at least its top layer, is usually the same semiconductor. The epitaxial layer may be in-situ doped to form three doping regions of vertical transistors. In some other cases, the semiconductor layer may be a topmost portion of the substrate which is itself a semiconductor.

In other cases, the semiconductor layer may be from a donor wafer (not shown) bonded to a substrate. The donor wafer may have a conducting or insulating layer disposed over it before being flipped and bonded to the substrate. After bonding, the donor wafer is polished or partly removed to leave a desired thickness. A partial removal of the donor wafer may be accomplished through polishing, or with a technique known as cleaving for reuse as a donor wafer for another substrate.

A mask 103 is patterned on semiconductor layer 102. The mask may be a photoresist or a hard mask, and is used to etch the semiconductor layer to form semiconductor pillars 104 shown in FIG. 1B. Each pillar will form a vertical transistor at a later stage of the manufacturing process. Alternatively, the semiconductor pillars may be formed in two consecutive sets of masking and etching. The semiconductor layer may have an underlying stack of conducting layer disposed on an insulating layer. A first mask consisting of many parallel strips is formed on the semiconductor layer, and is used to sequentially etch both the semiconductor layer and the conducting layer. As a result, semiconductor strips overlying conducting layer strips of a same size will be formed. The conducting layer strips serve as bit lines in some DRAM arrays. Then, a second mask consisting of many parallel strips perpendicular to those of the first mask is formed on the semiconductor strips, and is used to etch the semiconductor strips only to form an array of semiconductor pillars. Each semiconductor pillar formed in accordance with the alternative method takes a circular shape in a horizontal cross section as a result of etch effect, although an intersection of two perpendicular rectangles of a same size would yield a square. In the event that the semiconductor layer sits directly on an insulating layer, the second etch may leave a portion of semiconductor strips at the bottom. Any of the methods discussed herein for the formation of semiconductor pillars in the first embodiment equally apply in the other embodiments of the present disclosure.

After the semiconductor pillars are formed, a dielectric layer 106 is disposed and then planarized (e.g. through CMP, i.e. chemical mechanical polishing) such that the upper surface of the dielectric layer after planarization is above the semiconductor pillars. Subsequently, a blanket dielectric etch is applied until the upper surface of the dielectric layer goes down to a certain portion of the semiconductor pillars at the bottom, resulting in a relatively thin dielectric film and yielding a structure shown in FIG. 1C. Therefore, dielectric film 107 is a bottom portion of dielectric layer 106 remaining on the substrate after the latter is incompletely etched. In this manner of formation, the dielectric film not only covers the substrate but also surrounds a bottom portion of the pillars which forms a part of the three doped regions of the pillars which are the drain, channel, and source of the transistor. The doped region at the bottom of the pillar functions as source in one application and as drain in another application.

Figure 1B:
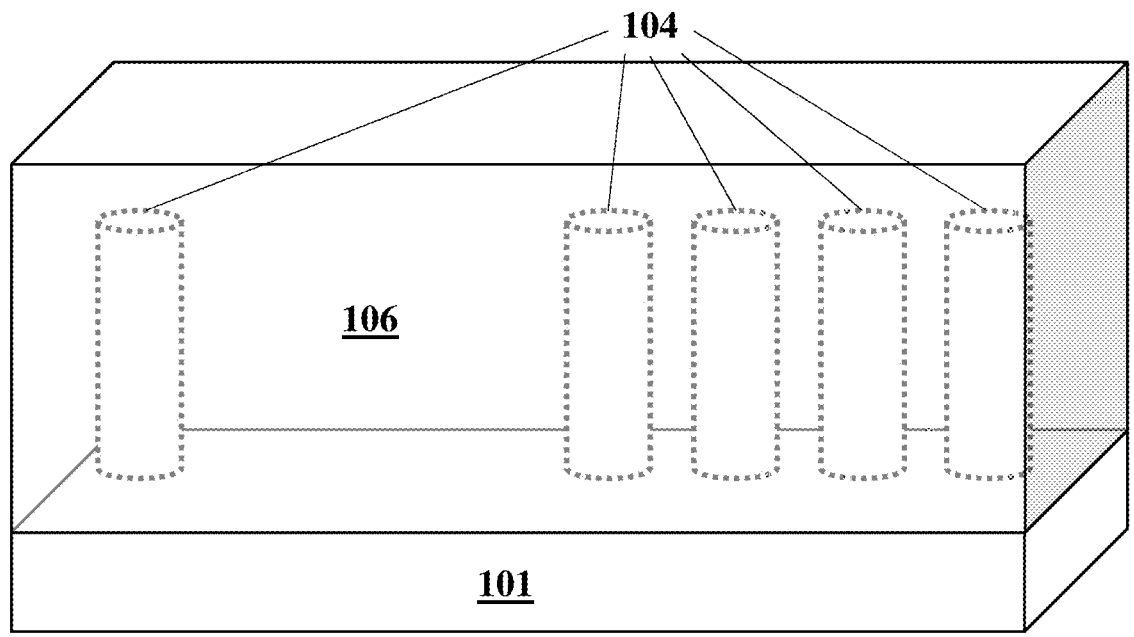
FIG. 1B is the structure of FIG. 1A changed after a planarized dielectric layer is disposed over and around semiconductor pillars that are formed by etching the semiconductor layer. The mask is removed subsequent to the etching and prior to the disposition of the dielectric layer.
Figure 1C:
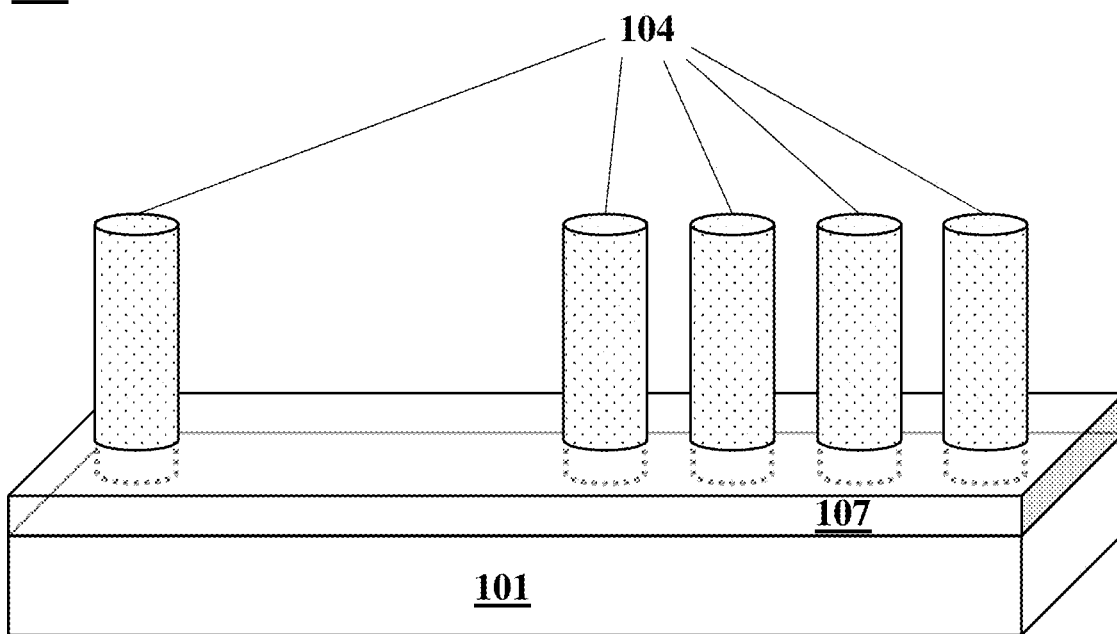
FIG. 1C is the structure of FIG. 1B changed after the planarized dielectric layer is etched incompletely to become a dielectric film surrounding a bottom portion of the semiconductor pillars.
Figure 1D:
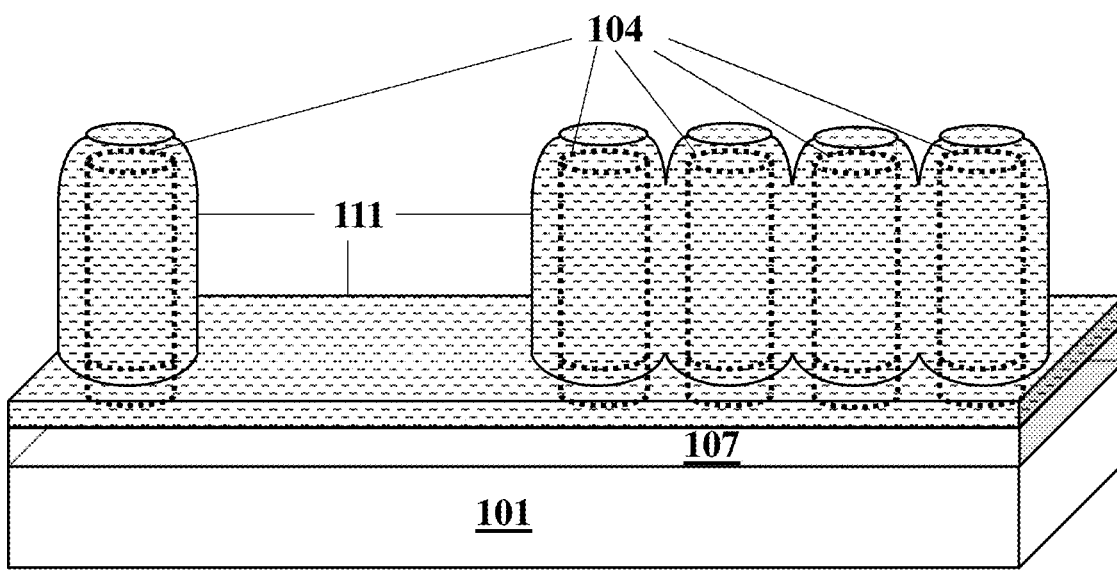
FIG. 1D is the structure of FIG. 1C changed after a gate film is conformally disposed.

FIG. 1D shows a structure after disposition of a gate dielectric (not shown) on semiconductor pillars 104 and conformal disposition of a gate film 111. The gate dielectric is shown in "2D" figures (such as FIG. 1F) of the present disclosure, but not shown (although present) in "3D" figures in order not to overcrowd the drawings. One skilled in the art understands that such gate dielectric exists in every transistor under the gate.

Gate dielectrics in advanced technologies are usually in the range of 3-4 nm thick for use in DRAM cells and 7-10 nm thick for use in NVM cells. When used in NVM cells, the gate dielectric includes a charge trapping layer and may consist of a dielectric stack of ONO (oxide-nitride-oxide) or constitute the middle three layers of TANOS (Titanium-Alumina-Nitride-Oxide-Silicon) gate stack.

As illustrated in FIG. 1D, a gate film is connected (or merged) between pillars in an array in which pillars are spaced sufficiently closely. The gate film around an isolated pillar (i.e., the pillar separated from the array) are like those at extreme ends of the array. With such understanding, embodiments of the present disclosure are illustrated with one-dimensional arrays of pillars (or arrays of vertical transistors constructed with pillar arrays). Isolated transistors (also known as single transistors) constructed with isolated pillars will also be considered covered by the disclosures herein, whenever applicable, whether claimed or not, as being apparent to those skilled in the art.

Figure 1E:
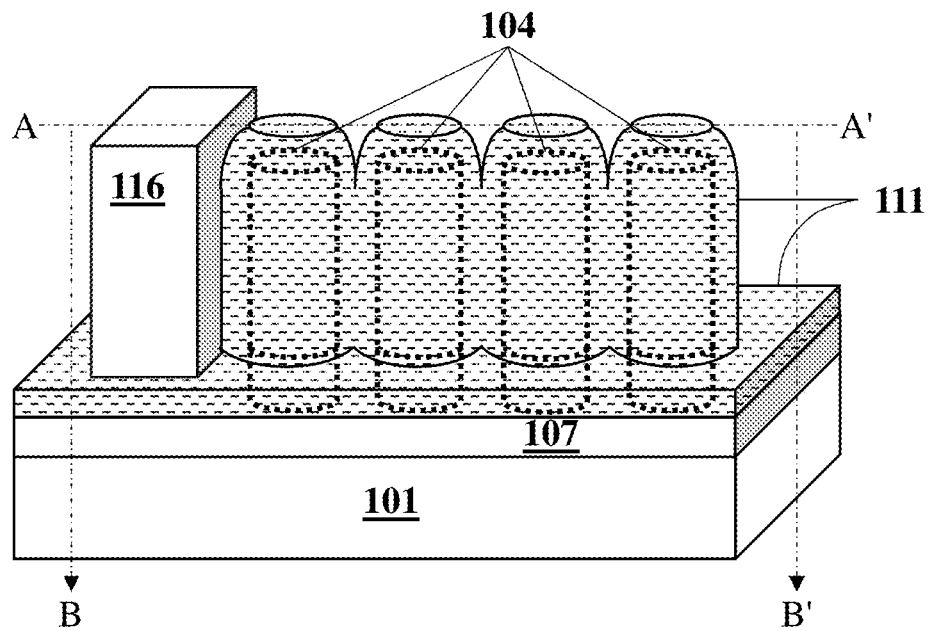
FIG. 1E is the structure of FIG. 1D changed after patterning a mask on the gate film beside an end of a one-dimensional array of vertical transistors.
Figure 1F:
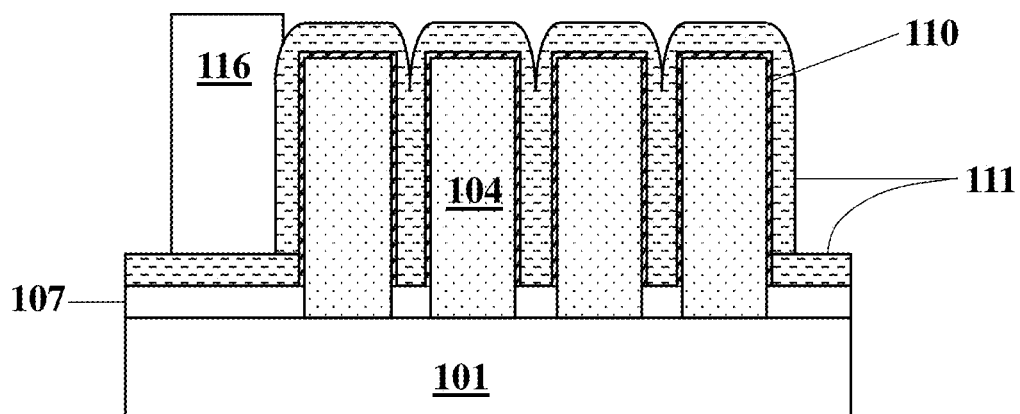
FIG. 1F is a cross-sectional view of the three-dimensional (3D) drawing of FIG. 1E when cut vertically by line A-A'. A gate dielectric is shown here and in subsequent two-dimensional (2D) drawings, but not in any 3D drawings of the present disclosure to avoid overcrowding of the figures.

Upon a self-aligned anisotropic etch with a sufficient over-etch, the gate film becomes the gate of vertical transistors shown in FIG. 1F. FIG. 1F is a cross-sectional view of the same structure cut vertically by line A-A'. The cross-sectional view is included for clearly demonstrating the relative positions of mask 116 and gate film 111 at an end of an array of vertical transistors. The line A-A' cuts through the centers of the semiconductor pillars in the vertical direction indicated by arrows B and B'. The shapes in FIG. 1F (and other drawings of the present disclosure) bearing the same fill pattern as that of the shape bearing reference number 104 are semiconductor pillars, in the absence of that reference number.

The gate dielectric may be disposed through a thermal growth or a deposition. In the case of thermal growth, one minor detail that is omitted in FIG. 1F but should be understood is that the pillars are slightly narrower where the gate dielectric is grown than where they are covered by the dielectric film. In the case of deposition, one minor detail that is omitted in FIG. 1F but should be understood is that the gate dielectric is present on the dielectric film as well as on the pillars. These types of minor details are considered to exist, although not explicitly depicted, in all subsequent figures.

A conventional method is to dispose a gate dielectric 110 after a dielectric film 107 is disposed. FIG. 1F is based on such a method and depicts the gate dielectric as covering the semiconductor pillars but not its bottom portion which is covered by the dielectric film. However, the gate dielectric may optionally be disposed before the dielectric film. In such a case, the gate dielectric may cover the substrate and the bottom portion of the semiconductor pillars as well as the other surfaces of the semiconductor pillars. This is particularly true when the gate dielectric is deposited or when the substrate is of the same or similar material as the pillars. All figures of the present disclosure depict the gate dielectric in accordance with a conventional method, but the optional sequence of disposition of the dielectric film and the gate dielectric is considered covered within the scope of the present disclosure.

Mask 116, typically a patterned photoresist, may be directly formed on a gate film 111, as depicted in FIGS. 1E-F. Since the mask is used to form an "extended" gate region, it must partly overlap with the vertical gate of the transistor to which the extended gate region is connected. However, there is a significant topography near the vertical side of the gate film caused by semiconductor pillars 104. It could pose a challenge on the photolithography required to form the mask at the bottom of and adjacent to vertical transistors, particularly when an anti-reflective coat is not disposed over the photoresist. However, the challenge can be alleviated with a set of good design rules, for example, on how far the mask and therefore the extended gate region must extend from the vertical transistor of interest.

With the mask thus patterned, anisotropic etch of the gate film followed by removal of the mask yields the structure of FIG. 1G which is a 3D perspective of structure 100. FIG. 1H shows a cross-sectional view of the same structure cut vertically (along arrows B and B') by line A-A' at the same horizontal position as in FIG. 1E. The cross-sectional view is included for clearly demonstrating the relative positions of extended gate region 119 and gate 112 at an end of an array of vertical transistors.

Extended gate region 119 is continuous with gate 112 of the vertical transistors. Dashed lines 104a (or 104b) in FIG. 1H indicate the boundaries between channel regions and top regions (or bottom regions) of semiconductor pillars. The lines are positioned to demonstrate that the top and bottom regions encroach under and overlap with gate 112. The portion of semiconductor pillars 104 surrounded by the gate is the "middle portion". The middle region (i.e. channel region of transistor) exists within the middle portion. The middle region has a doping type opposite to that of the top and bottom regions (i.e. source/drain regions of the transistor), as well known in the art.

One minor detail may be different in FIGS. 1G-H with respect to the shape of gate 112. The minor difference depends on the extent that mask 116 overlaps gate 112 and/or the semiconductor pillar of interest. The amount of such overlap may be determined by design or misalignment. Ordinarily, a sharp piece 120 of gate 112 may remain. It may nearly disappear when mask 116 overlaps gate 112 minimally (e.g., by "0.1 F") by design and a worst-case misalignment pulls the mask away from the semiconductor pillar of interest. It may partly go over a semiconductor pillar if mask 116 overlaps the semiconductor pillar of interest by design.

Another minor detail may be different in FIG. 1H with respect to gate dielectric 110. During the anisotropic dry etch for forming gate 112 which would not be 100% selective to the gate dielectric, and during the cleaning after that etch or prior to subsequent steps, for instance, the gate dielectric outside the gate, particularly at the top of semiconductor pillars 104, may be attacked and much thinner than at the area that is still under the gate. This minor detail is considered to exist in all subsequent figures, where applicable, though not explicitly illustrated or described.

Figure 1I:
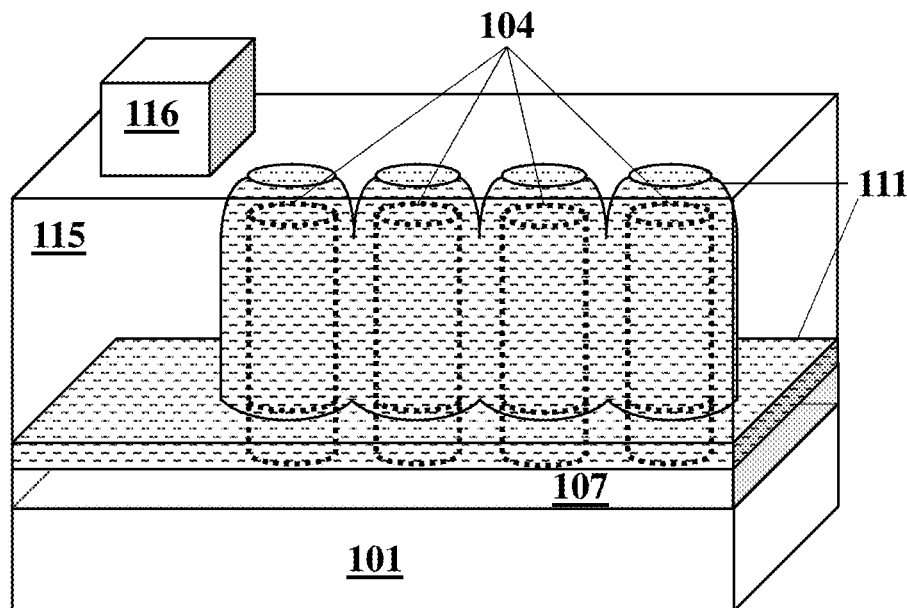
FIG. 1I is a structure alternative to that of FIG. 1E after patterning a mask on an optional dielectric layer disposed on the gate film and subsequently planarized.

FIG. 1I illustrates an alternative for forming mask 116. A dielectric layer 115 is disposed and planarized (e.g. by CMP) after disposing gate film 111. After planarization, the upper surface of the dielectric layer is above the gate film at the top of the pillars. A photolithography is performed over dielectric layer 115 to form mask 116. Since the mask is patterned over a planarized surface, the photolithography involved does not pose any issue at all, even without an aid from a design rule. To pattern gate film 111, a dielectric etch must precede a gate etch.

Figure 1J:
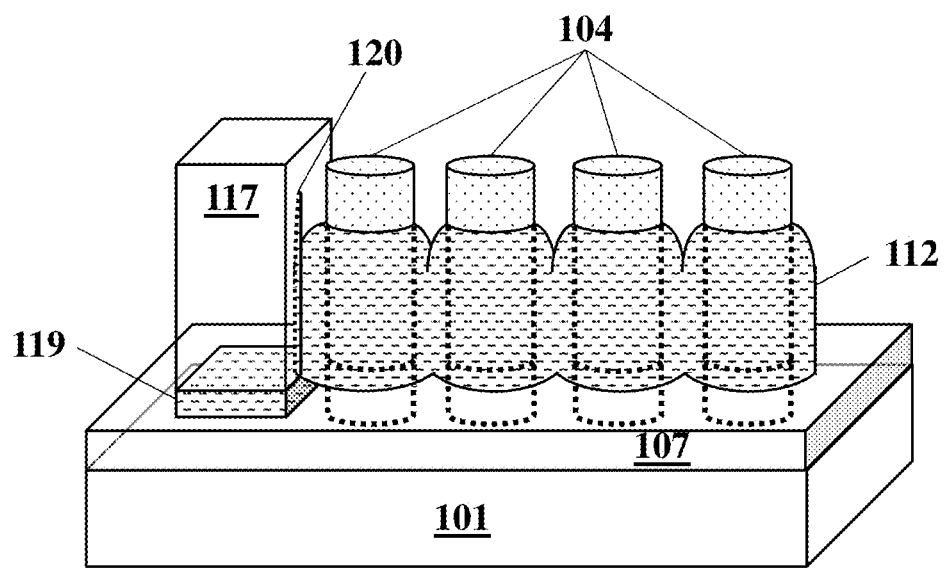
FIG. 1J is the structure of FIG. 1I changed after etching the optional dielectric layer and the gate film.

As shown in FIG. 1J, a tall block 117 of the dielectric layer remains after the etch steps. Dielectric block 117 is not normally removed, so that dielectric film 107 which is exposed outside the mask where the gate film is not etched away as well. Sharp gate piece 120 is formed inside the dielectric block at its boundary, because mask 116 overlaps gate 112 slightly by design. The presence of dielectric block 117 does not affect the steps of contact etch and subsequent process steps, because another dielectric layer of the same or similar chemical property is disposed and planarized before contact etch.

In FIG. 1K, a pre-metal dielectric 124 is that other dielectric layer. Typically, the pre-metal dielectric consists of a pure oxide film underlying a thick doped oxide layer such as PSG (phosphorus-doped oxide) or BPSG (borophosphosilicate glass). Dielectric layer 115 shown in FIG. 1I may be of the same or similar composition and/or stack as pre-metal dielectric 124. Formation of a metal 126 following the formation of gate contact 125 yields the structure of FIG. 1K, whether it started with the structure shown in FIG. 1E or FIG. 1I. Metal 126 may be of any conducting material such as tungsten, silicide, aluminum, copper, titanium nitride, etc.

In an array of vertical transistors constructed with semiconductor pillars spaced sufficiently closely so as to form one merged gate 112 for all the transistors in the array, only at least one of the vertical transistors in the array needs an extended gate region on a side of such at least one transistor. Typically, a one-dimensional array (or a row) of transistors arranged along a first horizontal direction is used in products containing a high-density memory module. Ordinarily, the memory module consists of multiple blocks, each of which in turn consists of numerous copies of the above-mentioned one-dimensional array made along a second horizontal direction perpendicular to the first horizontal direction. An example of a two-dimensional array is shown in FIG. 1L with two rows of vertical transistors, each row having a few transistors. Dashed lines 120a, which are one edge of extended gate regions 119 overlapping gate 112, indicate where sharp gate pieces 120 are formed. The use of two rows of vertical transistors in the array and a few transistors in each row is intended only for illustrating a two-dimensional array but not for limiting the size of an array to the illustrated numbers. A horizontal direction in the present disclosure is in a plane parallel to the top surface of the substrate and perpendicular to semiconductor pillars. A row as used in the present disclosure lies in any orientation on such a plane of a horizontal direction rather than conventionally called X-axis direction. The copies of the array made in the second horizontal direction are spaced sufficiently away from each other so as to separate the gates between arrays. In such a product, an extended gate region is usually patterned on the side of the vertical transistor at one or both ends of each array, and usually extends outward from the array along the first horizontal direction.

The space between one-dimensional arrays (e.g. between rows of a two-dimensional array) are generally in the neighborhood of "1.5 F" or wider. The gate film (111 of FIG. 1D) is made thick enough to fill the space between pillars in an array but thin enough to separate gates of transistors in different one-dimensional arrays (e.g. in different rows of a two-dimensional array). In general, a thickness of "0.5 F" or slightly thicker would be sufficient to meet these requirements, when the space between pillars in an array is "1 F" while the minimum space between arrays is approximately "1.5 F". Although only one-dimensional arrays (e.g. arrays of one row) are depicted in the illustrations of the present disclosure, two-dimensional arrays of multiple rows are considered covered within the scope of the present disclosure.

Alternatively, the extended gate region may be in a middle of a one-dimensional array, splitting the array into two usually equal halves with sufficient spacing between them to allow the extended gate region, as illustrated in FIG. 1M. As indicated by dashed lines 120a on both sides of extended gate regions 119, sharp gate pieces are formed at both sides of the extended gate regions where they overlap the gate on both sides. The alternative may be viewed as one extended gate region being shared between two one-dimensional arrays arranged along the first horizontal direction in the opposite side of the extended gate region. Gate 112 of each array then serves as a word line of that array, and gate contact 125 in conjunction with metal 126 serves as an electrode for supplying the word line.

2D arrays of vertical transistors are generally used in 3D memory products. They are constructed above a memory logic circuitry built on a substrate. An array includes word lines connecting the gate of vertical transistors in each row, and bit lines connecting the drain of vertical transistors in each column, and for NVM source lines connecting the source of vertical transistors in the array. The circuitry is coupled to word lines, bit lines, and source lines for a set of memory operations such as read, write, and refresh. Use of such circuitry is considered within the scope of the present disclosure.

An embodiment of DRAM 101A is shown in FIG. 1N incorporating storage capacitors and a memory logic circuitry coupled to vertical transistors. The vertical transistors are coupled at the top of semiconductor pillars 104 to storage capacitors 185 through contacts 194, and at the bottom of semiconductor pillars to memory logic circuitry 180 through vias 191 and interconnect limes 190. The transistors are coupled at the gate to the memory logic circuitry through a first inter-level via 192, metal line 126, and contact 125 on extended gate region 119, which collectively serve as a word line for each row. The storage capacitors are coupled to the memory logic circuitry through a metal line 196 and a second inter-level via 193. Typically the coupling are accomplished with multiple layers of metal lines at various levels. Vias and contacts coupling the various DRAM elements may be vertically stacked or staggered, the structures and method of which are well known in the art. Memory logic circuitry 180 is shown as embedded in substrate 101, which contains conventional planner devices and circuits built on a starting semiconductor material such as a silicon wafer. For 2D arrays as illustrated in FIG. 1L or FIG. 1M, each interconnect lines 190 is coupled to a bit line of vertical transistors. As described in previous paragraphs, a bit line runs along a column of vertical transistors arranged perpendicularly to the view of FIG. 1N. Storage capacitors 185 may be constructed under the vertical transistor. Or, the capacitors, whether planner or vertically oriented in cross section, may be constructed and stacked above the vertical transistors.

Figure 2B:
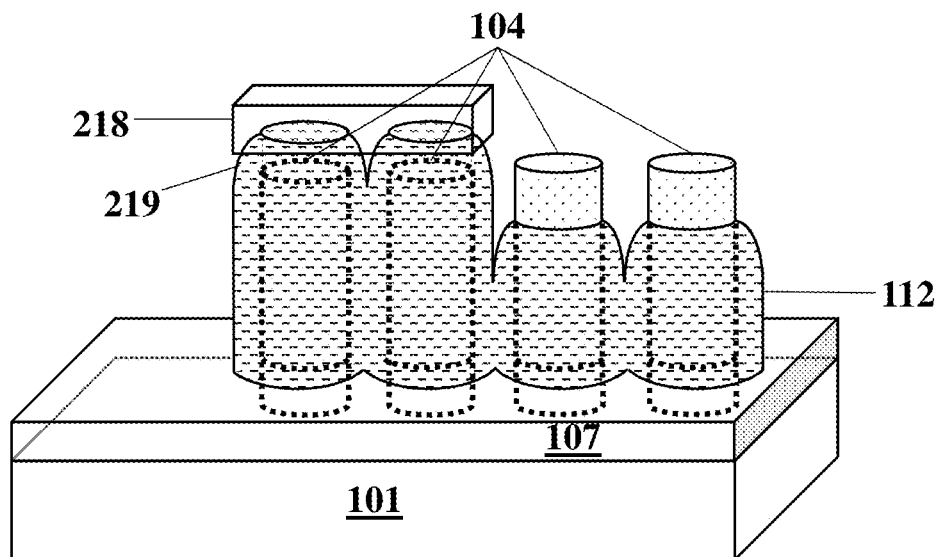
FIG. 2B is the structure of FIG. 2A changed after etching the dielectric layer and the gate film.
Figure 2C:
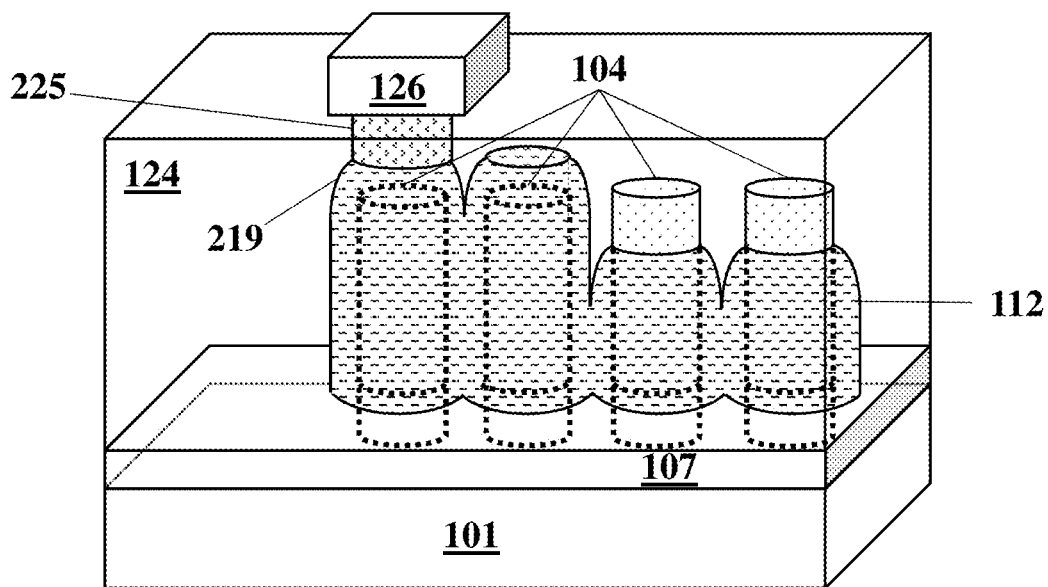
FIG. 2C is the structure of FIG. 2B changed after disposing a planarized pre-metal dielectric, forming a gate contact through the pre-metal dielectric, and patterning a metal over the gate contact and over the pre-metal dielectric.

A second embodiment of the present disclosure is illustrated in FIGS. 2A-C. Cross-sectional views are not included for the second embodiment because the intent of this embodiment can be clearly inferred from the drawings of this embodiment in light of those of the first embodiment. An extended gate region is patterned over one or more semiconductor pillars. This embodiment utilizes a modified transistor structure which leaves the gate film over its pillar. The extended gate region over a pillar or pillars, though not perfectly flat laterally, provides a sufficient area to serve as a landing pad for gate contact formation. The formation of the extended gate region over the pillars will result in the simultaneous surrounding of the sidewall of the pillar by the same gate film. Therefore, the extended gate region over the semiconductor pillar of interest is continuous with the transistor gate. The sequence of operations used in implementing the second embodiment is identical (or nearly identical) to that used for the first embodiment, except for the location of the extended gate region patterned (as well as the mask for such patterning).

A mask used in the second embodiment may be patterned directly on the gate film, the structure of which is not illustrated herein, as being an obvious alternative of the structures illustrated and methods described herein, for example by comparing FIG. 2A against FIG. 1I in light of FIG. 1E. The direct formation of the mask on the gate film in this case could be challenging for the photolithography involved because of the topography created by the tall semiconductor pillars, particularly in the absence of an anti-reflective coat disposed over the photoresist. However, like the case of FIG. 1E, the challenge can be mitigated with a set of good design rules to make the location of the mask more amenable to a photolithography process.

In FIG. 2A, a structure 200 for patterning a mask 216 for the extended gate region is illustrated. A dielectric layer 115 is disposed on a gate film 111 and planarized before patterning the mask. Etch of the dielectric layer in the presence of the mask and etch of the gate film in the presence of the dielectric layer thus patterned yields the structure illustrated in FIG. 2B upon the removal of the mask. A piece 218 of the dielectric layer remains in the place subjected to mask 216. Dielectric piece 218 is not normally removed lest dielectric film 107, which is exposed outside the mask where the gate film is etched away, be removed as well. The dielectric piece would not be present if dielectric layer 115 is not disposed and mask 216 is patterned directly on gate film 111, which is the situation mentioned in the preceding paragraph. As in the case of the alternative structure of FIG. 1J, dielectric piece 218 does not pose any issue for contact formation and subsequent process steps, because another dielectric layer of the same or similar chemical property called a pre-metal dielectric 124 as illustrated in FIG. 2C is disposed and planarized before patterning a mask (not shown) for gate contacts. Thus, FIG. 2C is a structure after forming a gate contact 225 and subsequently patterning a metal 126, whether or not dielectric layer 115 shown in FIG. 2A was used prior to patterning mask 216 for extended gate region 219.

Although FIGS. 2A-C illustrate the gate contact formation with two neighboring pillars to form one gate contact, one pillar may be used to form one gate contact, or more than two adjacent pillars may be used to form one or more gate contacts over them for a single array. In the case of multiple pillars being used for the purpose, the gate contact may be positioned anywhere over the extended gate region formed over the pillars, not necessarily at one end of those pillars. Likewise, the pillars of interest may be anywhere in the array, not necessarily at one end of the array.

There is a dielectric film, i.e. the gate dielectric (not shown), between gate film 111 and semiconductor pillars 104. Therefore, even though extended gate region 219 remains over the semiconductor pillars, the pillars are electrically isolated from the gate contact by the gate dielectric and do not affect other adjacent devices. The vertical transistor modified to have such an extended gate region 219 above it works like a dummy because one doped region at the top of the pillar that would otherwise constitute its "drain" or "source" is covered with the gate and thereby rendered inaccessible. A modified vertical transistor is ordinarily next to one or more vertical transistors with a sufficiently narrow space such that their gates become one merged gate 112. Then, the modified vertical transistor serves as a landing pad for forming gate contact 225 for the vertical transistors next to it. Gate 112 then serves as a word line of an array, and gate contact 225 in conjunction with metal 126 serves as an electrode for supplying the word line.

One minor detail may be different in FIGS. 2B-C with respect to the shapes of gate 112 and extended gate region 219. The difference comes usually from misalignment of mask 216 in relation to the gate. The extended gate region may have a small dent at a boundary if the mask is pulled away from the boundary. The gate of the transistor immediately outside the mask may have a sharp piece (like 120 of the first embodiment) if the mask is shifted over to that gate.

In general for products incorporating high density memory in advanced technologies, one or more sacrificial or dummy transistors or memory cells are patterned at all boundaries of arrays at the same spacing as the main transistors or memory cells in the array. This is to minimize variations due to optical and chemical proximity effects by maintaining regularity of main memory cells and thereby increase yield. These dummy transistors or memory cells offer an excellent site for modified vertical transistors without any further chip area sacrificed for them.

In a third embodiment of the present disclosure, a gate contact is made on a top surface of the gate merged between two closely spaced semiconductor pillars. It does not require an additional masking step before gate etch in order to pattern a landing pad for the gate contact. The surface area of a merged gate is at least twice as large as that of a single spacer-like gate of a transistor, and thus is good as a landing pad for gate contact formation.

Figure 3A:
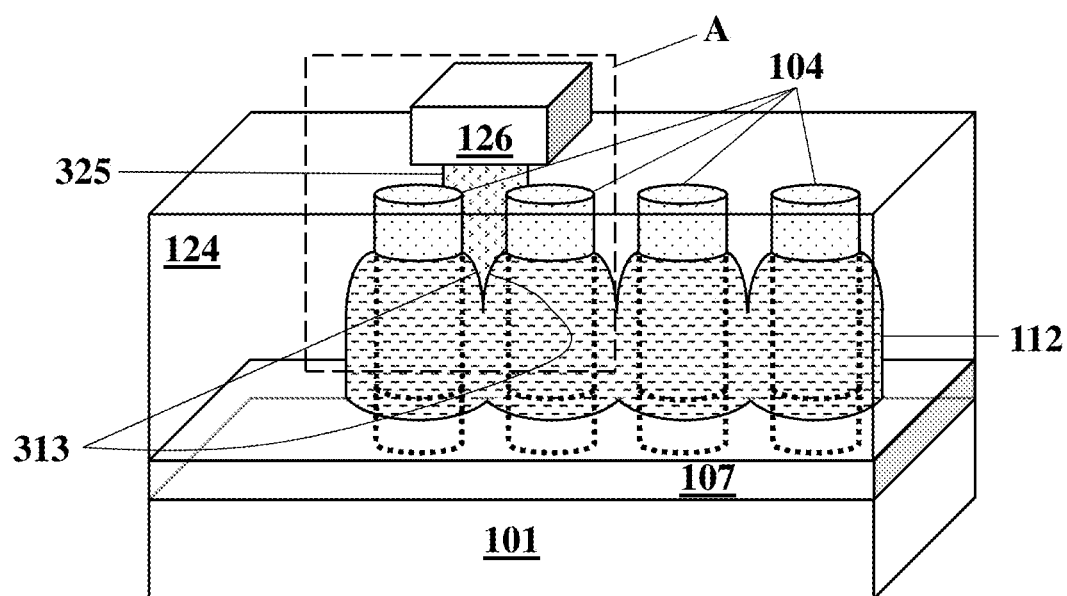
FIG. 3A illustrates a structure in accordance with a third embodiment of the present disclosure in which a gate contact is formed on the top surface of the gate merged between two closely spaced semiconductor pillars. Although the gate contact as depicted appears to be only behind the pillars in the 3D drawings pertaining to this embodiment, it also goes around between the pillars and in front of part of the pillars.
Figure 3B:
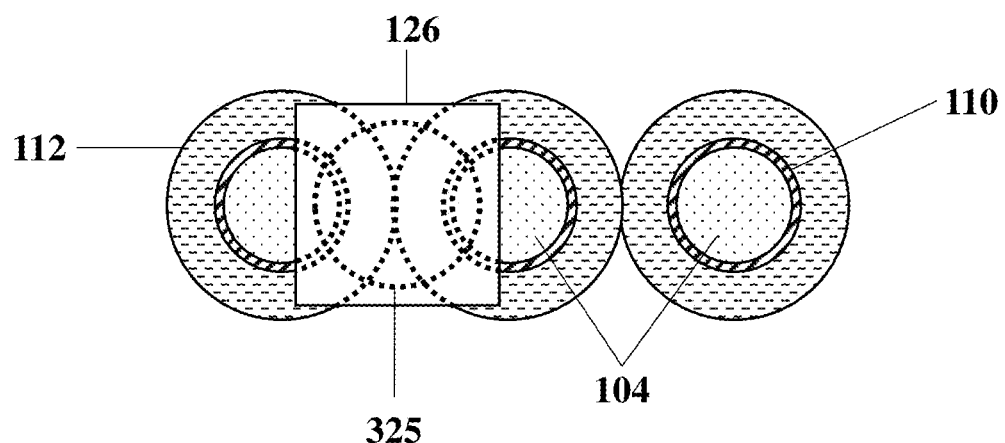
FIG. 3B is a top view of FIG. 3A illustrating that the gate contact is not merely on one side but on both sides of the pillars perpendicular to the direction of the one-dimensional array.

Referring to FIG. 3A which illustrates a structure 300 of the third embodiment, a pre-metal dielectric 124 is disposed and planarized after patterning gate 112 of the vertical transistors. A mask (not shown) for contact etch is formed on the pre-metal dielectric over between two vertical transistors whose pillars are spaced closely enough to form a merged gate 112 between them. Contact etch proceeds through pre-metal dielectric 124 and exposes a top surface 313 of gate 112 between the two adjacent transistors. In this figure, the gate contact as depicted appears to be standing only behind the pillars. However, as illustrated in FIG. 3B (a partial top view of FIG. 3A), the gate contact actually stands between the pillars and on both sides of the pillars perpendicular to the direction of the array. With such an understanding, the subsequent 3D figures pertaining to the third embodiment including its alternatives are depicted in the same manner as FIG. 3A.

Figure 3C:
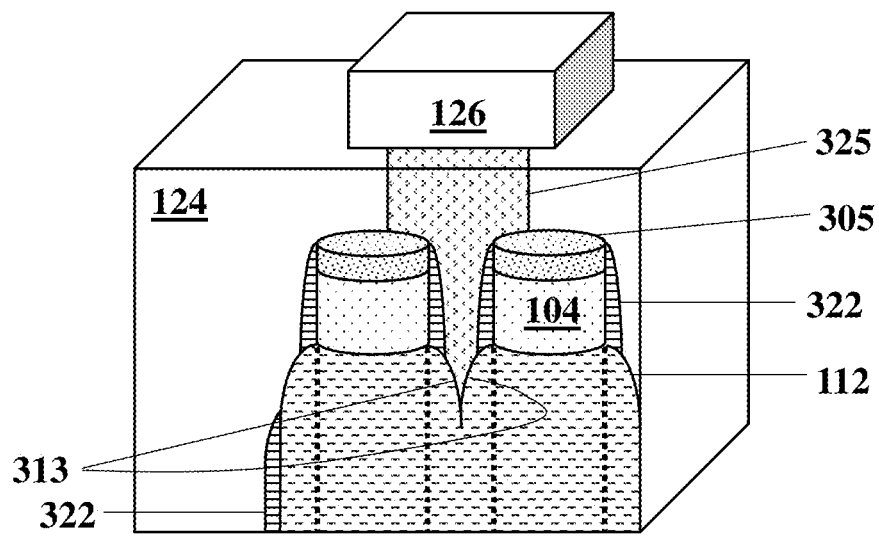
FIG. 3C is a zoom-in view of FIG. 3A within box A with the semiconductor pillars optionally isolated from the gate contact by a hard mask and a SAC film, with the SAC film subjected to a blanket anisotropic etch before disposing a planarized pre-metal dielectric. The SAC film in conjunction with the hard mask completely surrounds the semiconductor pillars at their top portions.

FIG. 3C is a zoom-in view of FIG. 3A within box A and illustrates a structure 300A for electrical isolation of semiconductor pillars 104 from gate contact 325. By virtue of the electrical isolation, there is no resistive leakage path from the gate contact to the adjacent transistors sharing gate 112. A hard mask 305 on the top surface of each pillar is present before patterning the pillars and remains on the pillars all the way to the end of a manufacturing process. The hard mask and the pillars are patterned with one etch mask (not shown in FIG. 3C but corresponding to 103 of FIG. 1A), or an etch mask, usually a photoresist, is used to pattern the hard mask and then removed, followed by patterning of the pillars with the hard mask used as a mask for pillar patterning.

A SAC (self-aligned contact) film 322 is disposed over the entire surface of the structure after gate 112 is formed. Subsequently, the SAC film is subjected to a blanket anisotropic etch before disposing pre-metal dielectric 124. The SAC film remains on all vertical sides, but not on any horizontal or slanting sides. However, the SAC film is not drawn in the front of FIG. 3C in order to simplify the drawing. Hard mask 305 remaining after etching the semiconductor layer (not shown in FIG. 3C but corresponding to 102 of FIG. 1A) to form pillars 104 is sufficiently thicker than the as-disposed thickness of SAC film 322. So, hard mask 305 is not completely removed during the over-etch phase of the SAC film etch. Pre-metal dielectric 124 through which gate contact 325 is formed is disposed and planarized before patterning a mask (not shown) for contact etch.

Hard mask 305 and SAC film 322 are used to electrically protect the pillars from gate contact 325 and are thus of a different material than pre-metal dielectric 124 surrounding the vertical transistors. For example, the hard mask and the SAC film are nitride and the pre-metal dielectric is oxide. Then, high etch selectivity (for example, etch rate ratio of 10:1 for the oxide vs. nitride) is used for the gate contact etch. So, the hard mask and the SAC film remain at the end of gate contact etch that etches through the dielectric layer. The top doping regions of the pillars are ordinarily rendered inaccessible because it is nearly (if not completely) impossible to form contacts to the top regions of the affected pillars.

In FIG. 3C, SAC film 322 as depicted appears to stand behind the vertical transistors. In fact, the SAC film goes around the front (as well as the back) of the figure. The approximate pseudo-2D representation of the actual structure in FIG. 3C is an attempt to demonstrate that the SAC film takes a shape of sidewall spacers.

Figure 3D:
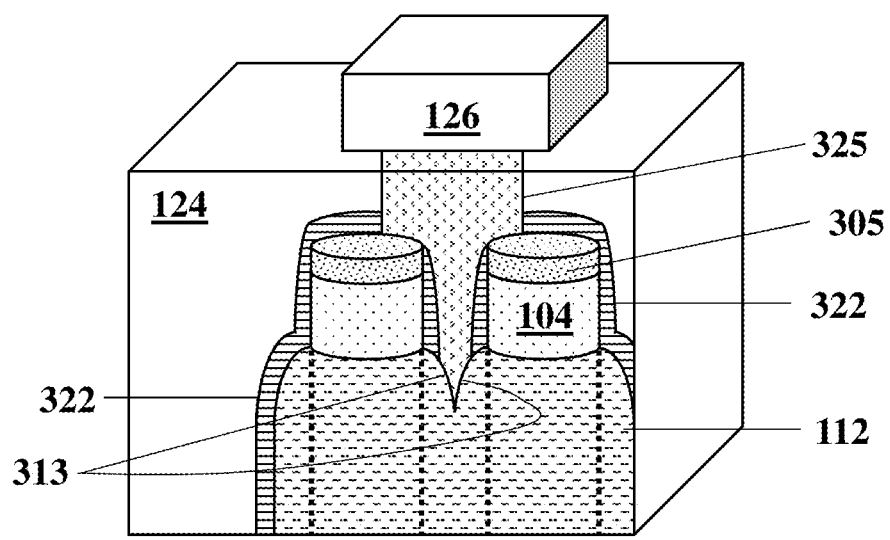
FIG. 3D is a zoom-in view of FIG. 3A within box A with the semiconductor pillars optionally isolated from the gate contact by a hard mask and a SAC film, without etching the SAC film before disposing a planarized pre-metal dielectric. The SAC film in conjunction with the hard mask completely surrounds the entire structure except at the bottom of the gate contact.

FIG. 3D is a zoom-in view of FIG. 3A within box A and illustrates an alternative structure 300B for electrical isolation of semiconductor pillars 104 from gate contact 325. The operations used to arrive at structure 300B are identical to those for FIG. 3C up to the point of disposing SAC film 322. Unlike in FIG. 3C, however, the SAC film is not etched before disposing pre-metal dielectric 124. Rather it is etched as a second step of gate contact etch. In other words, the gate contact etch is performed by etching the pre-metal dielectric in a first step and by proceeding to the second step of etching the SAC film from a top surface 313 of the gate merged between the two transistors. As with FIG. 3C, the hard mask is disposed thick enough to remain at least partly within the gate contact after the second step.

In FIG. 3D, hard mask 305 and SAC film 322 are used to electrically protect the pillars of interest from gate contact 325. The SAC film need be of a different material than pre-metal dielectric 124 surrounding the vertical transistors. For example, the SAC film is nitride and the pre-metal dielectric is oxide, and the hard mask may be either nitride or oxide. However, the hard mask need be of a material with a much slower etch rate than a planarized dielectric layer (not shown but corresponding to 106 of FIG. 1B) that is blanket-etched to form dielectric film 107 shown in FIG. 3A. For example, the dielectric layer is a doped oxide for at least above what remains as the dielectric film, and the hard mask is an undoped oxide. This is to have the hard mask partly left after forming the dielectric film. It is likely, however, that the hard mask is of the same or similar material as the SAC film and thus of a different material than the dielectric film which is of a similar material as the pre-metal dielectric.

With sufficient selectivity in favor of a faster etch rate for the pre-metal dielectric during the first step of the gate contact etch, the SAC film remains on the hard mask at the end of the first step that etches through the pre-metal dielectric. Upon detecting the end point of the first step, the gate contact etch switches to etch the SAC film in the second step. If the hard mask is of the same material as the SAC film or if the second step is not sufficiently selective to the hard mask, the hard mask is disposed thick enough to withstand the second step, especially the over-etch phase thereof. If the hard mask is of a different material than the SAC film, and if the second step is sufficiently selective to the hard mask, the hard mask may be disposed much thinner. Then, the hard mask remains at the end of the second step that removes the SAC film from the top surface of the gate within the contact.

Either or both of hard mask 305 and SAC film 322 are optional. If any parts of the surfaces at the top portion of the pillar are not covered by either of them, the gate contact will simultaneously touch the gate and a top portion of the pillars at the same time. Such a contact provides bias not only to the gate but also to the top portion of the pillar. Therefore, the pillar having this type of contact would work as a resistor when a bias is applied to the contact. Such a resistor may be used for the sense-amplifier formation at the edge of a memory cell array. FIG. 3A, as it appears to represent, may be considered as depicting the absence of the hard mask and SAC film.

SAC film 322 as depicted in FIG. 3D appears to be cleared off entirely from the top surface of hard mask 305 and to stand behind the vertical transistors. In fact, clearance of the SAC film from the top surface of the hard mask and from top surface 313 of gate 112 is only within gate contact 325. The SAC film entirely covers the remaining surfaces of the gate, the pillars, and the hard mask, and goes around the front of them. The approximate representation of the actual structure in FIG. 3D is an attempt to demonstrate the spacer-like shape of the SAC film within the gate contact.

Figure 3E:
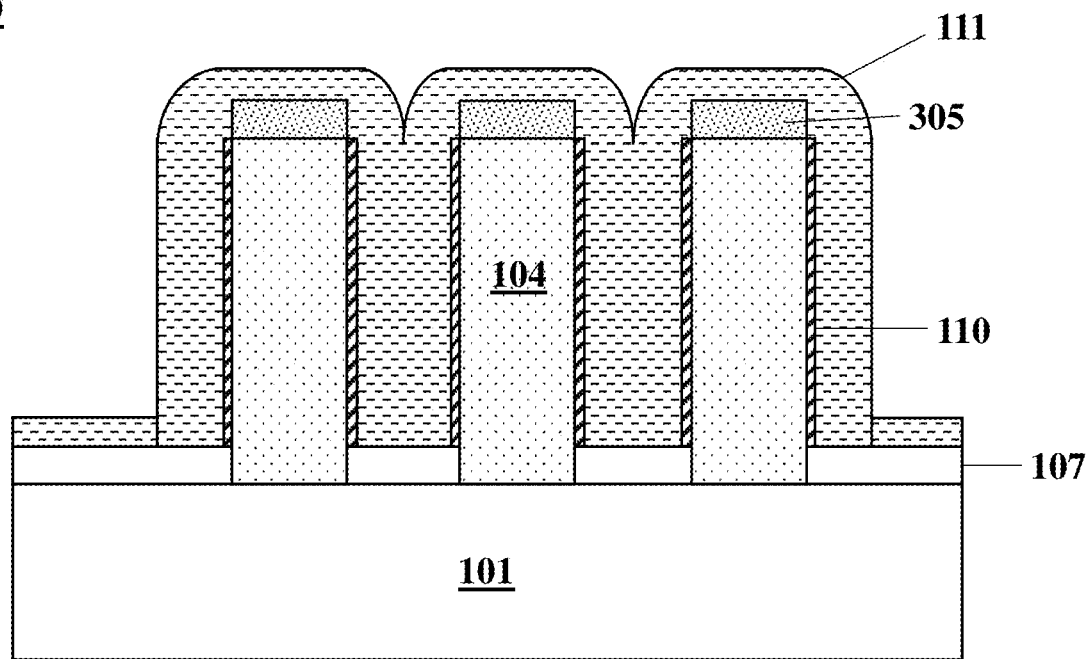
FIG. 3E is a cross-sectional view of a structure in a sequence of steps for isolating the pillars from the gate contact as in FIG. 3C or FIG. 3D after a gate dielectric is disposed over stacks of hard mask and pillar, and a gate film is subsequently disposed.
Figure 3F:
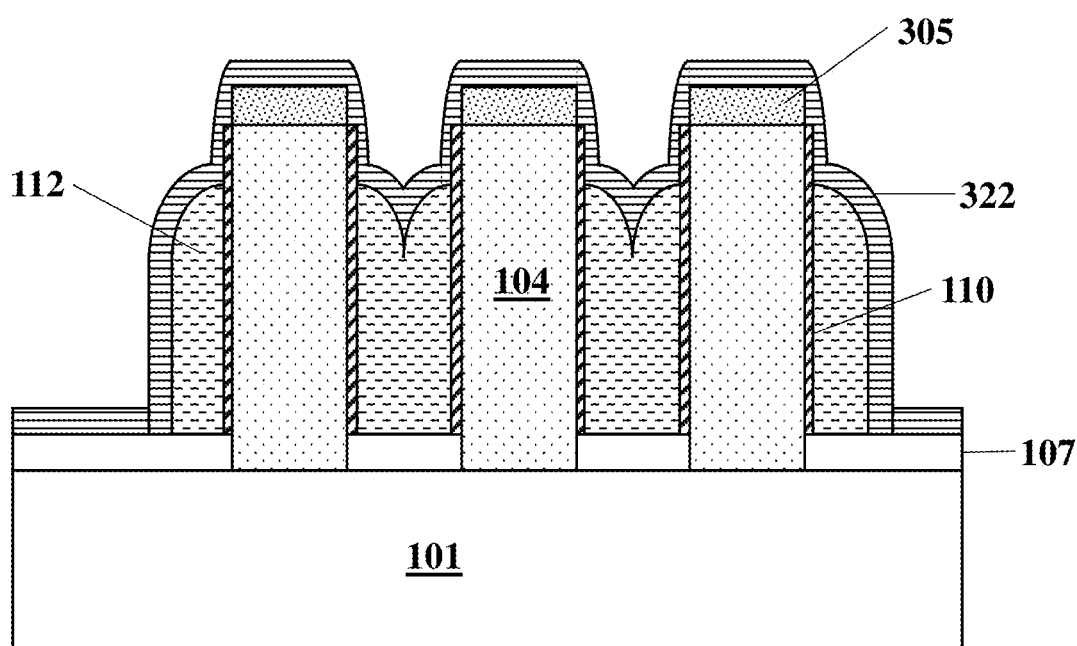
FIG. 3F is a cross-section view of the structure changed from that of FIG. 3E after the gate film is etched to form the gate and a SAC film is disposed for use as an etch-block layer at a later stage.

FIGS. 3E-H illustrate how structure 300 changes in a sequence of operations that lead to FIG. 3C or FIG. 3D. FIGS. 3E-F are common to the two cases, because the process steps for realizing them are identical up to FIG. 3F except for minor differences in thicknesses and/or compositions of certain material, as mentioned in reference to FIG. 3D in comparison with FIG. 3C. Afterwards, the process steps diverge in order to reach FIG. 3G and FIG. 3H, which are cross-sectional views that correspond to FIG. 3C and FIG. 3D, respectively.

Figure 3G:
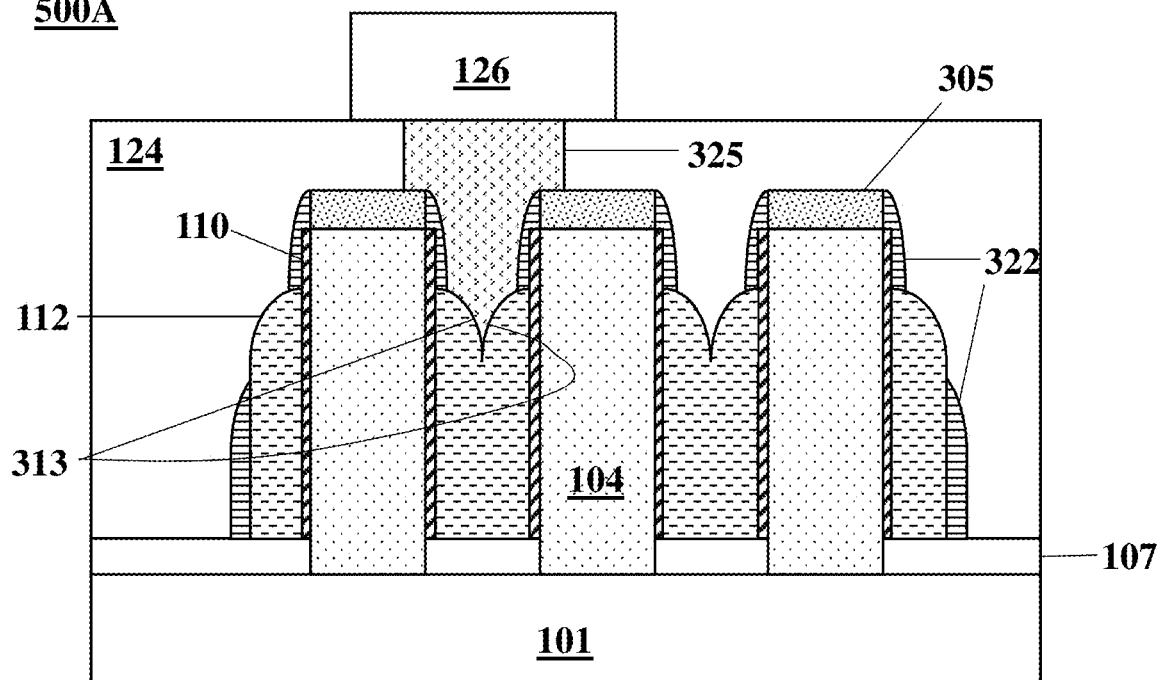
FIG. 3G is a cross-section view of the structure in a sequence of steps for isolating the pillars from the gate contact as in FIG. 3C, changed from that of FIG. 3F after a blanket anisotropic etch of the SAC film and subsequently disposing a planarized pre-metal dielectric followed by formation of a gate contact and subsequent patterning of a metal over the contact and over the pre-metal dielectric.
Figure 3H:
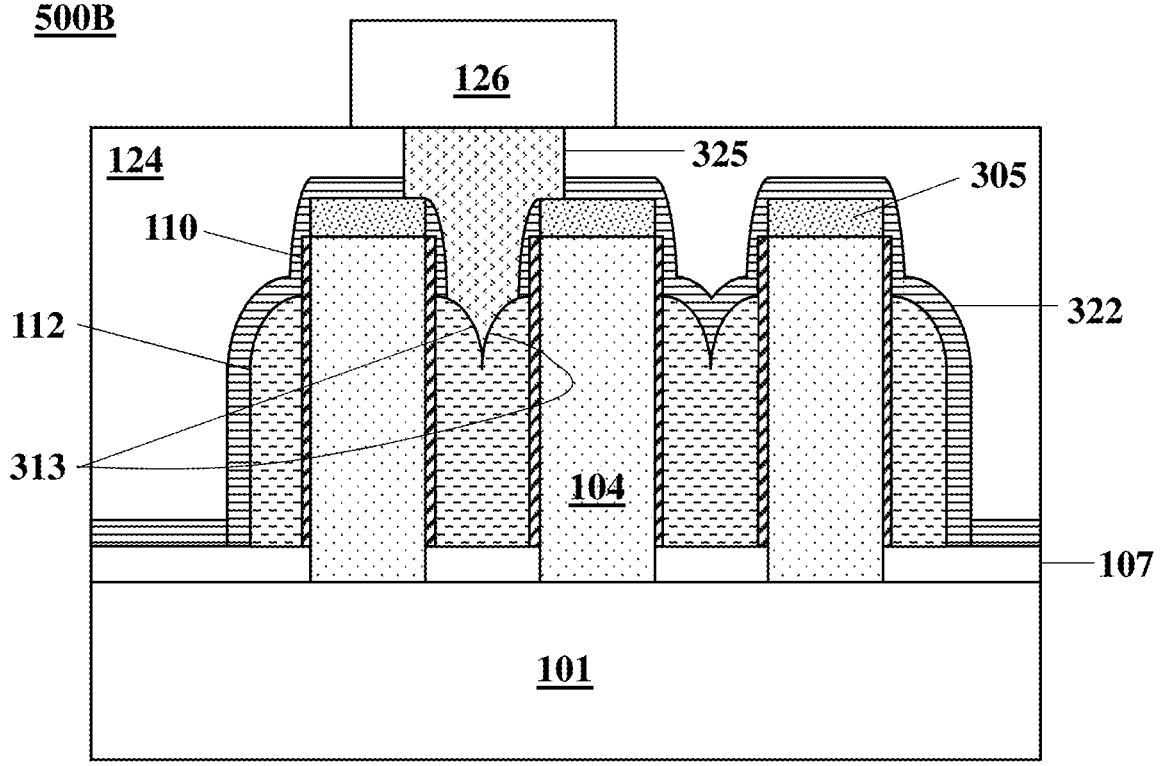
FIG. 3H is a cross-sectional view of the structure in a sequence of steps for isolating the pillars from the gate contact as in FIG. 3D, and is an alternative of FIG. 3G. The SAC film is not etched before disposing a pre-metal dielectric but as a second step of gate contact etch after a first step of etching through the pre-metal dielectric.
Figure 3I:
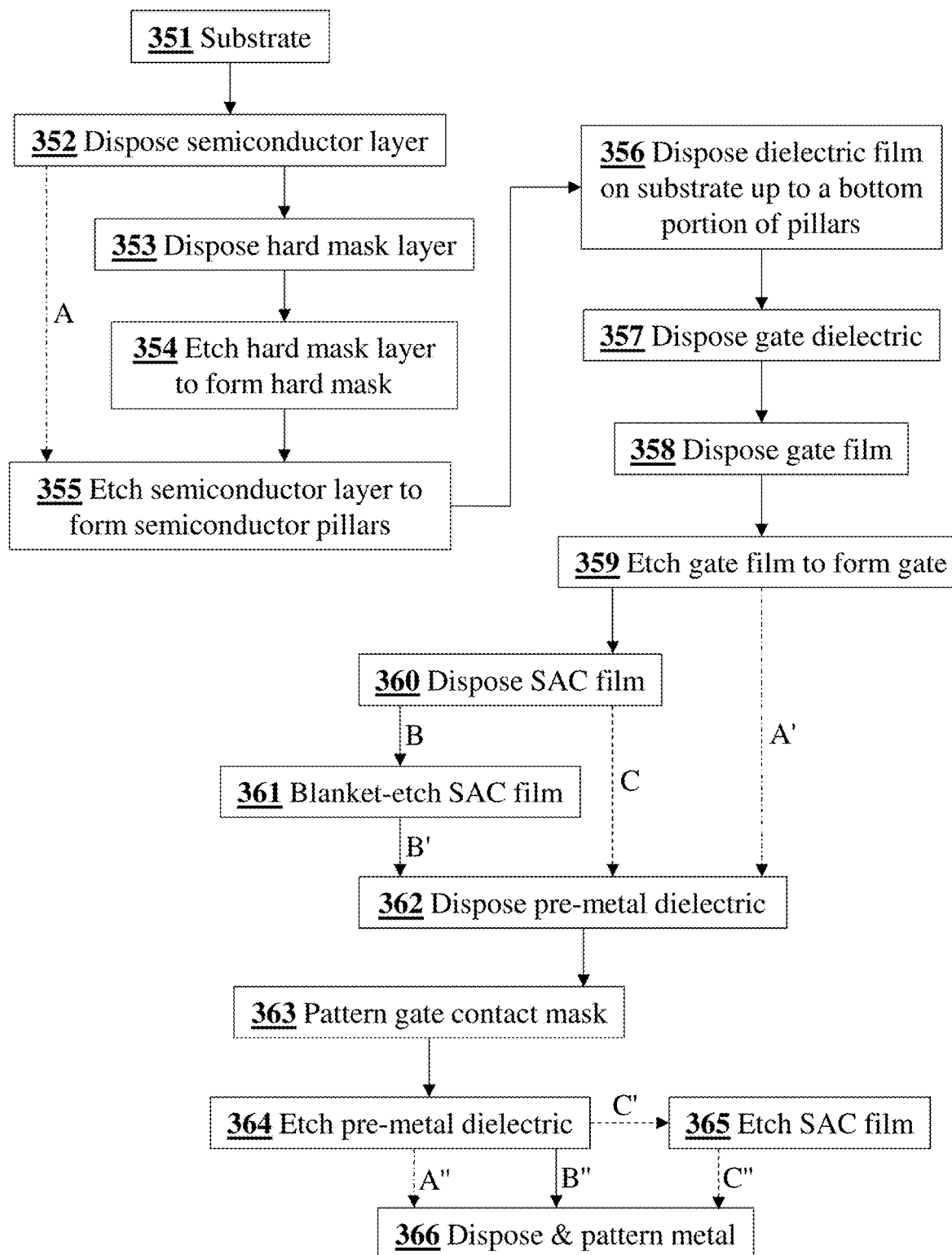
FIG. 3I is a flowchart illustrating methods of forming a structure in accordance with the third embodiment.

FIG. 3I is an exemplary sequence of the process steps illustrated with FIGS. 3E-H. The transitions indicated by dot-dashed arrows A (from operation 352 to 355) and/or A' (from operation 359 to 362), together with the transition along dot-dashed arrow A" (from operation 364 to 366), result in the situation mentioned in the paragraph about the absence of the hard mask and/or the SAC film. The set of transitions indicated by solid-line arrows B (from operation 360 to 361), B' (from operation 361 to 362), and B" (from operation 364 to 366) results in the case depicted in FIG. 3C, while the set of transitions indicated by dashed-line arrows C (from operation 360 to 362), C' (from operation 364 to 365), and C" (from operation 345 to 346) results in the case depicted in FIG. 3D. In the following paragraphs that describe the operations pertaining to FIGS. 3E-H, all references to operation numbers are to those of FIG. 3I. Transitions unlabeled by an alphabet are common to all cases of FIGS. 3A-D.

Several fabrication steps are involved to reach the structure of FIG. 3E. A semiconductor layer (not shown but corresponding to 102 of FIG. 1A) that leads to the formation of semiconductor pillars 104 is disposed (operation 352) over a substrate 101 (operation 351), followed by disposition (operation 353) of a hard mask layer (not shown) that leads to the formation (operation 354) of hard mask 305. With an etch mask (not shown but corresponding to 103 of FIG. 1A) patterned over the hard mask layer, both the hard mask layer and the semiconductor layer are etched (operations 354 and 355) sequentially to form hard mask 305 and pillars 104. Alternatively, the etch mask may be stripped after patterning the hard mask which then is used as a mask for patterning the semiconductor layer (operation 355). Then, a dielectric layer (not shown but corresponding to 106 of FIG. 1B) is disposed and planarized, followed by a blanket etch of the dielectric layer down to a certain portion of the semiconductor pillars at the bottom, resulting in a relatively thin dielectric film 107 (operation 356).

A gate dielectric 110 is disposed (operation 357) over semiconductor pillars 104. In one approach, the gate dielectric is thermally grown with partial consumption of the semiconductor pillars. Then, only the exposed surfaces of the pillars, i.e., the surface of the pillars not covered by hard mask 305 or dielectric film 107, will be covered by the gate dielectric. Such a situation is approximately depicted in FIG. 3E as an example. One minor detail that is omitted in the drawing but should be understood is that the pillars are slightly narrower where the gate dielectric is grown than where they are covered by the dielectric film. The pillars become slightly narrower than the hard mask as well. In another approach, the gate dielectric is deposited, covering the exposed surfaces of any material, i.e., the hard mask, the pillars, and the dielectric film. Subsequent to the disposition (operation 357) of the gate dielectric, a gate film 111 is conformally disposed (operation 358).

FIG. 3F illustrates the structure changed after a blanket anisotropic etch (operation 359) of the gate film followed by a conformal disposition (operation 360) of a SAC film 322. As noted earlier, up to this point in a manufacturing process, the process steps are identical (or nearly identical) regardless of when the SAC film is etched, i.e., whether FIG. 3C or FIG. 3D is a later structure.

SAC film 322 may be blanket-etched (operation 361) prior to the disposition of any other material such as pre-metal dielectric 124. FIG. 3G illustrates a later structure 300A in such a case. The SAC film remains on all vertical sides, but not on any horizontal or slanting sides. The process steps subsequent to the SAC film etch was described earlier in reference to FIG. 3C. These steps are those following a set of transitions indicated by solid-line arrows B, B', and B" in FIG. 3I. Since there is no hard mask or SAC film on dielectric film 107 and the gate contact which is usually large enough to spill outside gate 112 along a direction perpendicular to the direction of the semiconductor pillars 104 in the array, the situation of which is illustrated in FIG. 3B, a timed etch is used to avoid etching through the dielectric film and thereby shorting the gate contact to substrate 101. There is an ample margin for the timed etch because the pillars are sufficiently tall and the gate contact need only reach a surface at a very elevated height.

Alternatively, the SAC film is not etched until the gate contact is being formed. Transitioning from FIG. 3F to FIG. 3H, corresponding to a set of transitions indicated by dashed-line arrows C, C', and C" in FIG. 3I, subsequent to the disposition (operation 360) of SAC film, a pre-metal dielectric 124 is disposed and planarized (operation 362). With a gate contact mask (not shown) patterned (operation 363) over the pre-metal dielectric, a first step in gate contact etch is selective to the SAC film and etches (operation 364) through the pre-metal dielectric until the first step reaches the SAC film and stops or slows down. Then, a second step of gate contact etch follows to etch the SAC film (operation 345). The second step is selective to gate 112 and stops upon reaching the gate. After etch, within the gate contact, the SAC film remains only as a spacer-like piece but is cleared off from a top surface 313 of the gate. The SAC film remains untouched outside the gate contact. Since dielectric film 107 is of the same or similar material as pre-metal dielectric 124 but of a different material than the SAC film, the second step of the gate contact etch is selective to the dielectric film and the pre-metal dielectric as well as the gate. Since the SAC film is present on the dielectric film before the gate contact etch, the second step of the gate contact etch is not required, though permitted, to be a timed etch in order to avoid shorting the gate contact to the substrate.

Figure 4A:
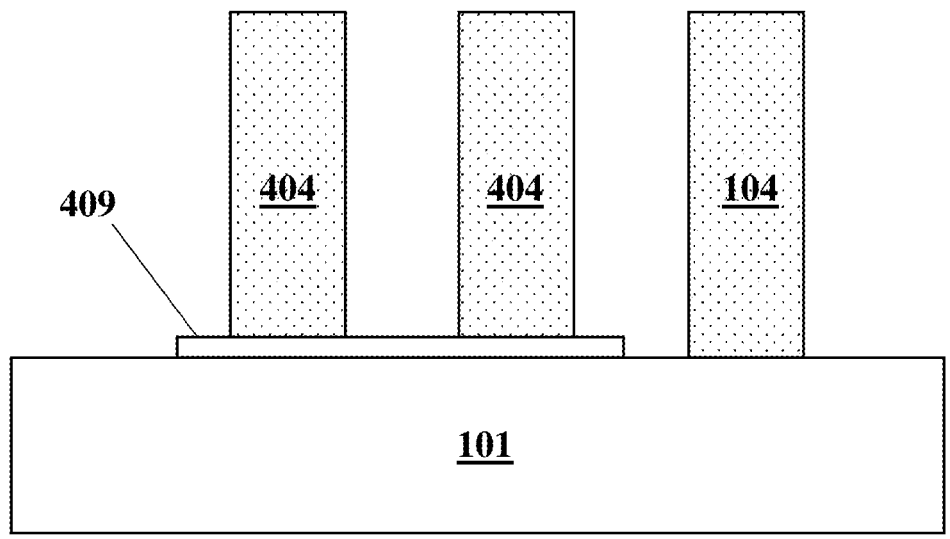
FIG. 4A is a cross-sectional view of a structure alternative to that of FIG. 3A, at an early stage in a sequence of steps implementing an example of electrically isolating semiconductor pillars in accordance with the third embodiment. The pillars between which a gate contact is formed are let shorted to the gate via the gate contact as a result of not using a hard mask on the pillars or later the SAC film on the sidewall of pillars. However, the pillars to be affected by a gate contact are isolated from the substrate by an insulator and thereby from the rest of the pillars standing on the substrate.
Figure 4B:
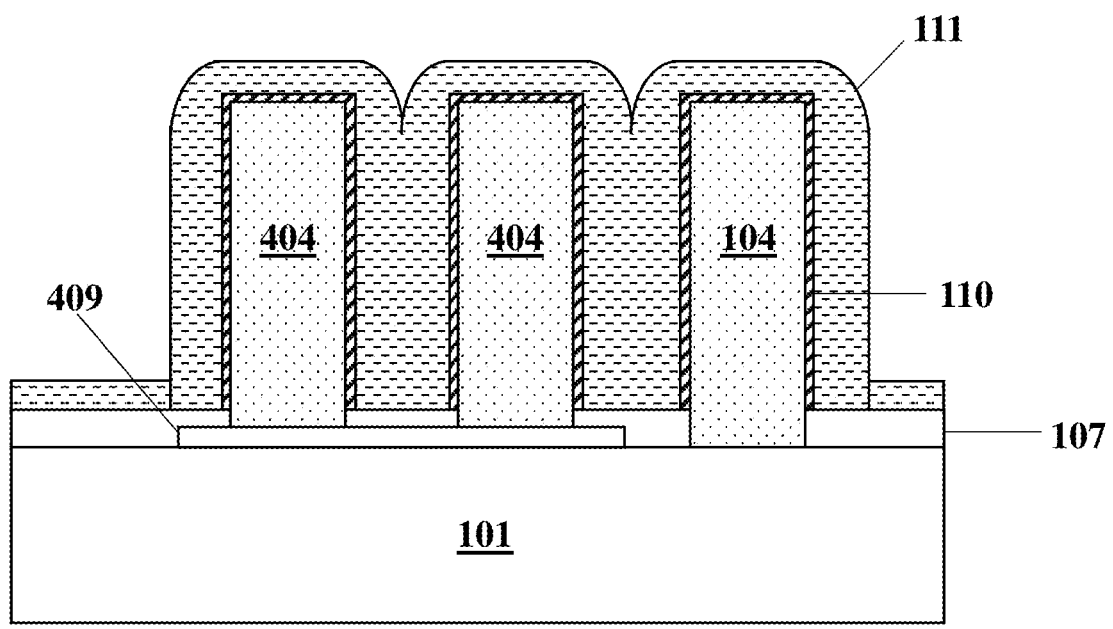
FIG. 4B is a cross-sectional view of the structure changed from that of FIG. 4A after disposing a gate dielectric and subsequently a gate film.
Figure 4C:
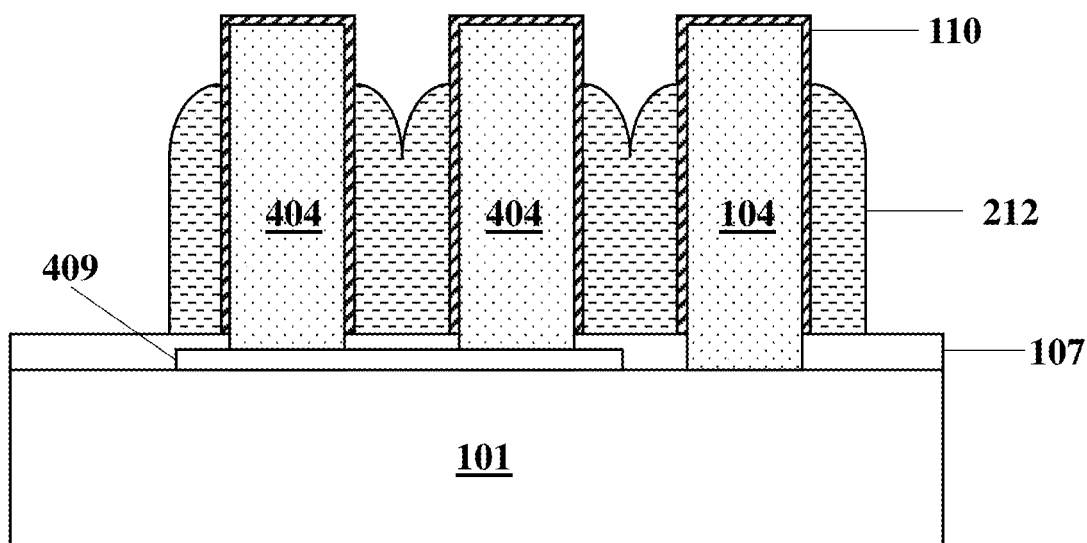
FIG. 4C is a cross-sectional view of the structure changed from that of FIG. 4B after the gate film is etched anisotropically to form the gate of vertical transistors.
Figure 4D:
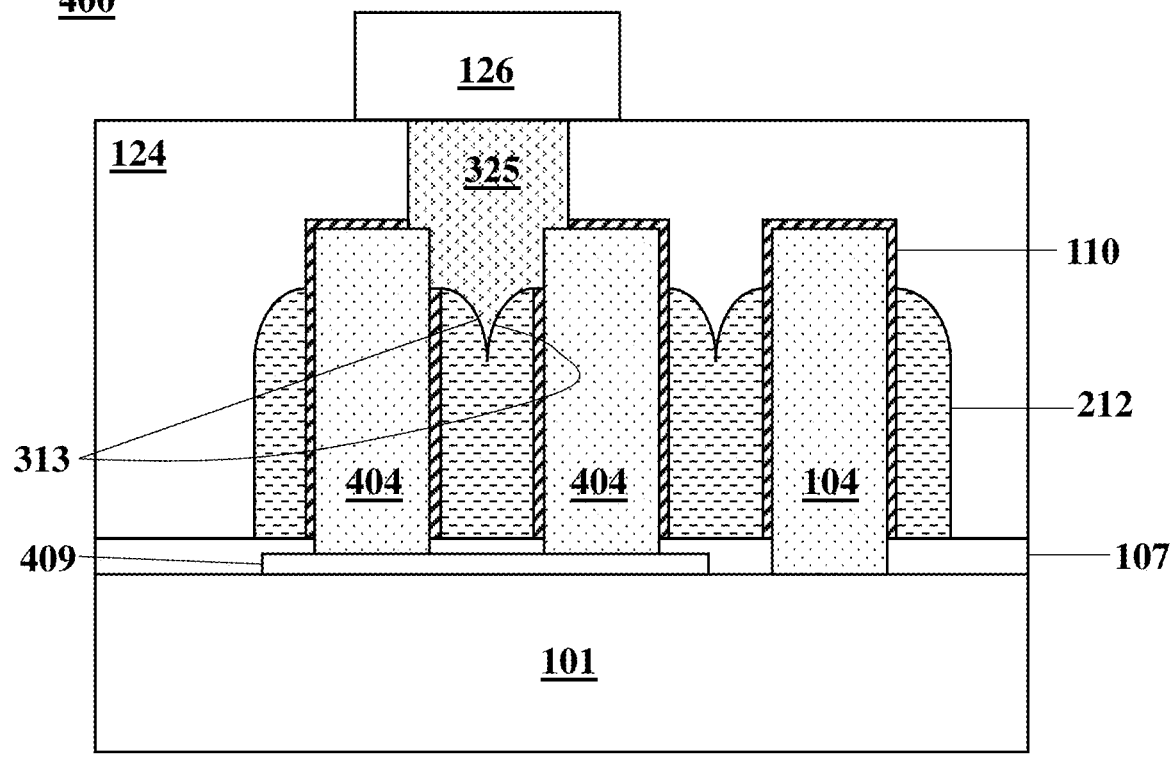
FIG. 4D is a cross-sectional view of the structure changed from that of FIG. 4C after disposing a planarized pre-metal dielectric with subsequent patterning of a gate contact through the dielectric followed by patterning a metal over the contact.
Figure 4E:
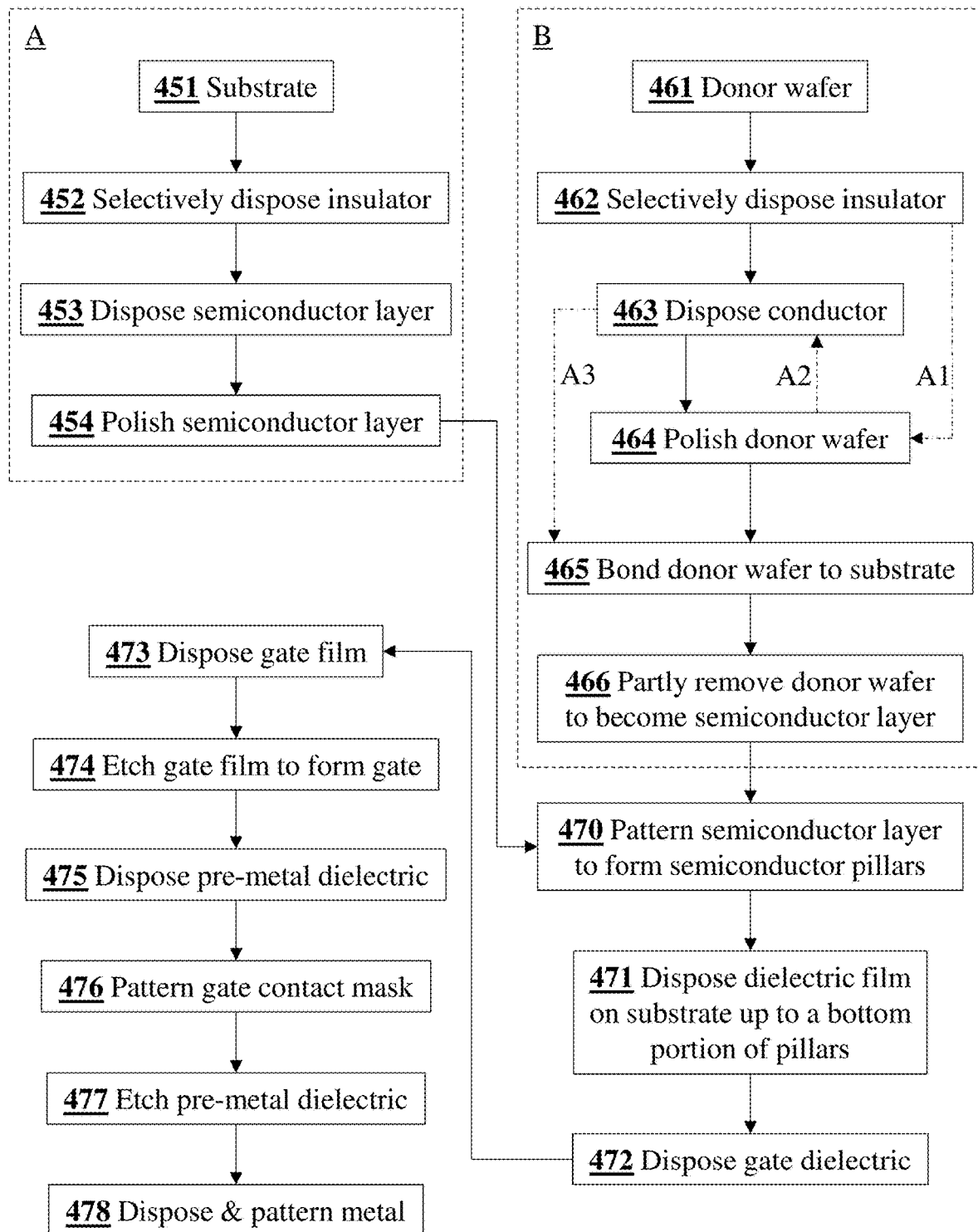
FIG. 4E is a flowchart illustrating method of forming the alternative structure in accordance with the third embodiment.

With FIGS. 4A-E we illustrate and describe an alternative structure 400 and method for the third embodiment of the present disclosure. Illustrated herewith is an example of electrically isolating semiconductor pillars. There are other structures and methods for electrically isolating semiconductor pillars, such as the method of forming semiconductor pillars with two sets of masking and etching, described in reference to FIG. 1B. FIG. 4E is an exemplary sequence of the method for constructing structure 400. In this alternative, the pillars of interest are let shorted to the gate by the gate contact but are isolated from the substrate in order to cut off the path of leakage current flow and to prevent any impact to the other transistors in the same array as the transistors affected by the gate contact. In the following paragraphs that describe the process steps pertaining to FIGS. 4A-D, all references to step numbers are to those of FIG. 4E.

FIG. 4A illustrates the structure after several steps in a manufacturing process. In one approach, an insulator 409 is patterned (operation 462) over a substrate 101 (operation 451), selectively in places where the pillars of interest will be formed. Then, a semiconductor layer (not shown but corresponding to 102 of FIG. 1A) is disposed (operation 453), e.g. through an epitaxial growth, and planarized (operation 454). It is subsequently patterned (operation 470) to form semiconductor pillars 104 and 404 with a method such as the one described in reference to FIGS. 1A-C. Note that pillars 404 of interest are isolated from substrate 101 by insulator 409, while other pillars 104 are not. This approach is depicted in the top-left branch (box A) of FIG. 4E, starting from substrate 101 (operation 451) to the planarization of the semiconductor layer (operation 454). The portion of the semiconductor layer grown epitaxially over insulator 409 may not be a completely single crystal. However, this is of no concern because these pillars formed from such portion of the semiconductor layer do not conduct any current which is blocked by insulator 409.

In another approach, the semiconductor layer is a topmost portion of a donor wafer (not shown) and the substrate receives the donor wafer by bonding. This approach is depicted in the top-right branch (box B) of FIG. 4E, starting from a donor wafer (operation 461) to the partial removal of the donor wafer (operation 466) subsequent to the bonding (operation 465). The donor wafer has an insulator selectively patterned (operation 462) on its top surface where the transistors of interest will be formed. Subsequent preparation of the donor wafer suitable for bonding may be accomplished in various ways. Some examples of the preparation methods are described in the next few paragraphs. Upon proper preparation, the donor wafer is flipped and then bonded (operation 465) to substrate 101. After bonding, the donor wafer is polished (operation 466) to a desired thickness to form the semiconductor layer which is then patterned (operation 470) to form semiconductor pillars 104 and 604 of a desired height.

In a first method of preparing the donor wafer for bonding, the insulator may be selectively grown on the donor wafer. As a result of selective thermal growth of the insulator, a thickness of the donor wafer which is approximately half of the insulator thickness is consumed, and the surface of the donor wafer is recessed under the insulator but the top surface of the insulator is raised above that of the donor wafer outside the insulator. Thus, a subsequent polishing (operation 464) would planarize the entire surface to the same level, suitable for bonding.

In a second method of preparing the donor wafer for bonding, the insulator may be selectively grown or blanket-disposed and patterned. Then, a metal such as titanium, cobalt, nickel, etc. is disposed (operation 463). A subsequent polishing (operation 464) would even out the surface of the donor wafer, thus properly preparing the donor wafer for bonding. Alternatively, the disposition of the metal and the polishing of the donor wafer may be performed in reverse order (by following the dot-dash arrows A1, A2, and A3). The metal as disposed is relatively thick so that some portion of it remains after achieving a planarized surface with the polishing. Upon an adequate heat treatment subsequent to the bonding, the metal serves to enhance the bonding strength, particularly when the top surface of the substrate is a semiconductor or a material similar to or the same as the metal.

A third method of preparing the donor wafer for bonding is like the second method with an additional step between disposition and polishing of the metal. The donor wafer receives a proper heat treatment to form silicide layer on the exposed surface of the donor wafer outside the patterned insulator. Since silicide will not form over an insulator, the surface of the silicide may be made more or less on the same level as that of the insulator where it was lower before the silicidation. The thickness of the insulator and the time of the silicidation may be adjusted to result in more or less flat surface overall. A subsequent polishing (operation 464) would even out the surface of the donor wafer, thus properly preparing the donor wafer for bonding. Unlike a conventional selective silicidation, however, there is no need to clear unreacted portion of the metal. When a heat treatment follows the wafer bonding to enhance the bonding strength, the donor wafer is subject to little (if any) additional silicidation in the donor wafer as a result of prior silicidation.

A fourth method of preparing the donor wafer for bonding is like the second method except that a semiconductor film is epitaxially grown rather than disposing a metal. The donor wafer would be properly prepared for bonding upon polishing (operation 464). The polishing need not remove the epitaxial semiconductor film completely from over the insulator. The quality of the epitaxial semiconductor film is of no concern because the film will not contribute to any part of semiconductor pillars 104 and 404. The pillars are from a top portion of the original donor wafer prior to the selective disposition (operation 462) of insulator 409.

FIG. 4B shows structure 400 changed after a few operations are performed on that of FIG. 4A. A dielectric film 107, a gate dielectric 110, and a gate film 111 are disposed in sequence (operations 471, 472, and 473). If the gate dielectric is thermally grown, the structure will be approximately like that shown in FIG. 4B. In such a case, one minor detail that is omitted but should be understood is that the pillars are slightly narrower where the gate dielectric is grown than where they are covered by the dielectric film. If the gate dielectric is deposited, it will also be present over the dielectric film with the same thickness. Upon an anisotropic etch (operation 474) with a sufficient over-etch, the gate film becomes a gate 112 with the form shown in FIG. 4C.

The structure shown in FIG. 4D is a change from that of FIG. 4C after applying process steps of disposing a pre-metal dielectric 124 with a subsequent planarization (operation 475), patterning a gate contact 325 (operation 476) through the pre-metal dielectric, and patterning a metal 126 (operation 478) over the gate contact and over the pre-metal dielectric. As noted previously, the gate contact exposes a top surface 313 of merged gate 112 between pillars 404 of interest. Although the gate contact shorts out the gate to the pillars of interest, it will not affect the adjacent transistors with the same merged gate 112, because insulator 409 at the bottom of the selected pillars will isolate them from the substrate that would otherwise short them to other pillars 104 in the array sharing the same merged gate.

Although insulator 409 is embedded within dielectric film 107 in FIGS. 4B-D, it may be thicker as disposed than the final thickness of the dielectric film before etching the dielectric layer (106 of FIG. 1B). In that case, the insulator may become of the same thickness as the dielectric film after etch and form a flushed surface with the dielectric film. This is particularly true when the insulator and the dielectric film are of the same material, or when the etch step of the dielectric layer is not selective to the insulator.

As mentioned at the end of the description of the second embodiment, one or more of sacrificial or dummy transistors or memory cells are typically patterned at all boundaries of memory arrays at the same spacing as the main memory cells in the array to maintain regularity of main memory cells and thereby increase yield. These dummy transistors or memory cells, particularly when more than one is used for better yields, are an excellent site, without further requiring extra chip area sacrificed, for the pair of vertical transistors of interest whichever alternative structure 300 or 400 of the third embodiment is used.

The various embodiments and their alternatives disclosed herein are not mutually exclusive. Use of one embodiment or alternative in a chip does not preclude the use of any other embodiments or alternatives in the same chip. In other words, any two or all of them may be used in any combination in a single chip. For example, the extended gate region of the first embodiment may be used for an isolated transistor, and the modified transistor of the second embodiment or the transistor pair of the third embodiment may be used for an array anywhere in the array.

As used throughout the present disclosure, the word "may" is used in a permissive sense (i.e., meaning "having the potential to"), rather than a mandatory sense (i.e., meaning "must" or "required to"). Similarly, the words "include," "including," and "includes" mean "including, but not limited to" the listed item(s).

The foregoing descriptions of specific embodiments of the present disclosure have been presented for purposes of illustration and description. The embodiments were chosen and described in order to explain the principles of the invention and its practical application in the best way, and thereby enable others skilled in the art to best utilize the invention and various embodiments with various modifications as are suited to the particular use contemplated. They are not intended to be exhaustive or to limit the invention to the precise forms disclosed. Many modifications, variations, and rearrangements are possible in light of the above teaching without departing from the broader spirit and scope of the various embodiments. For example, they can be in different sequences than the exemplary ones described herein, e.g., in a different order. One or more additional new elements or steps may be inserted within the existing structures or methods or one or more elements or steps may be abbreviated or eliminated, according to a given application, so long as substantially equivalent results are obtained. Accordingly, structures and methods construed in accordance with the principle, spirit, and scope of the present invention may well be embraced as exemplarily described herein. It is intended that the scope of the invention be defined by the Claims appended hereto and their equivalents.

I claim:

1. A vertical transistor comprising:
   a semiconductor pillar standing over a substrate;
   a gate dielectric disposed over at least a portion of said semiconductor pillar;
   a gate surrounding a middle portion of said semiconductor pillar over said gate dielectric; and
   an extended gate region extending horizontally from a bottom edge, but not from a top edge, of said gate; and
   a sharp gate piece formed vertically where said extended gate region overlaps said gate.

2. The vertical transistor of claim 1, wherein said semiconductor pillar comprises:
   a first region of a first doping type in said middle portion of said semiconductor pillar;
   a second region of a second doping type occupying a top portion of said semiconductor pillar, extending partly into said middle portion from said top portion, and contiguous with said first region; and
   a third region of said second doping type occupying a bottom portion of said semiconductor pillar, extending partly into said middle portion from said bottom portion, and contiguous with said first region.

3. The vertical transistor of claim 1, further comprising:
   a dielectric film disposed over said substrate up to a bottom surface of said extended gate region and surrounding a bottom portion of said semiconductor pillar.

4. The vertical transistor of claim 1, further comprising:
   a gate bias line; and
   a gate contact disposed on said extended gate region and coupled to said gate bias line.

5. The vertical transistor of claim 1, further comprising:
   a circuitry constructed under said vertical transistor; and wherein:
      said circuitry is electrically coupled to said gate and to said semiconductor pillar.

6. The vertical transistor of claim 1, wherein:
   said gate is in the shape of a sidewall spacer.

7. An array comprising:
   a plurality of vertical transistors, each comprising:
      a semiconductor pillar standing over a substrate;
      a gate dielectric disposed over at least a portion of said semiconductor pillar; and
      a gate surrounding a middle portion of said semiconductor pillar over said gate dielectric;
   extended gate regions; and wherein:
      said array comprises at least one row;
      each of said at least one row has at least one of said extended gate regions;
      each of said at least one of said extended gate regions in each of said at least one row extends horizontally from a bottom edge, but not from a top edge, of said gate of at least one of said plurality of vertical transistors in each of said at least one row;
      a space between said semiconductor pillars of immediate neighbors of said plurality of vertical transistors in each of said at least one row is sufficiently narrow and said gate film is sufficiently thick such that said plurality of vertical transistors are coupled at said gate along each of said at least one row; and
   where said plurality of semiconductor pillars are arranged in said array with at least two rows, a space between said at least two rows is sufficiently wide and said gate film is sufficiently thin such that said plurality of vertical transistors are disconnected at said gate between said at least two rows.

8. The array of claim 7, wherein said semiconductor pillar of each of said plurality of vertical transistors comprises:
   a first region of a first doping type in said middle portion of said semiconductor pillar of each of said plurality of vertical transistors;
   a second region of a second doping type occupying a top portion of said semiconductor pillar of each of said plurality of vertical transistors, extending partly into said middle portion from said top portion, and contiguous with said first region; and
   a third region of said second doping type occupying a bottom portion of said semiconductor pillar of each of said plurality of vertical transistors, extending partly into said middle portion from said bottom portion, and contiguous with said first region.

9. The array of claim 7, further comprising:
   a dielectric film disposed over said substrate up to a bottom surface of said extended gate regions and surrounding a bottom portion of said semiconductor pillar of each of said plurality of vertical transistors.

10. The array of claim 9, wherein:
    said gate dielectric of each of said plurality of vertical transistors is disposed over said dielectric film.

11. The array of claim 7, further comprising:
    gate bias lines;
    gate contacts; and wherein:
       each of said gate contacts is disposed on one of said extended gate regions;
       each of said at least one row has one or more of said gate contacts;
       each of said at least one row has one of said gate bias lines; and
       said one of said gate bias lines in each of said at least one row is coupled to said one or more of said gate contacts.

12. The array of claim 7, wherein:
    said at least one of said plurality of vertical transistors in each of said at least one row is at an end of each of said at least one row; and
    each of said extended gate regions in each of said at least one row extends outward from said end.

13. The array of claim 7, further comprising:
    a plurality of storage capacitors, each with a first electrode and a second electrode; wherein:
       each of said plurality of vertical transistors has said first electrode of one of said plurality of storage capacitors coupled to said semiconductor pillar to form a type of DRAM cell.

14. The array of claim 13, wherein:
    each of said storage capacitors is disposed over said semiconductor pillar to which it is coupled.

15. The array of claim 13, further comprising:
    a memory logic circuitry constructed under said plurality of vertical transistors for a memory operation; and wherein:
       said memory logic circuitry is electrically coupled to said second electrode of each of said storage capacitors, to said extended gate regions, and to said semiconductor pillar of each of said plurality of vertical transistors for said memory operation; and
       each of said plurality of vertical transistors serves as a switch for said memory operation.

16. The array of claim 7, wherein:
said gate dielectric of each of said plurality of vertical transistors comprises a charge trapping layer to form a type of nonvolatile memory cell.

17. The array of claim 16, further comprising:
a memory logic circuitry constructed under said plurality of vertical transistors for a memory operation; and wherein:
said memory logic circuitry is electrically coupled to said extended gate regions and to said semiconductor pillar of each of said plurality of vertical transistors for said memory operation; and
each of said plurality of vertical transistors serves as a switch for said memory operation.

18. The semiconductor device of claim 7, further comprising:
sharp gate pieces; wherein:
each of said sharp gate pieces is formed vertically in only one of said at least one row where each of said extended gate regions overlaps said gate.

19. An array comprising:
a plurality of vertical transistors, each comprising:
a semiconductor pillar standing over a substrate;
a gate dielectric disposed over at least a portion of said semiconductor pillar; and
a gate surrounding a middle portion of said semiconductor pillar over said gate dielectric;
a dielectric film covering said substrate up to bottom surface of said extended gate regions and surrounding a bottom portion of said semiconductor pillar of each of said plurality of vertical transistors;
extended gate regions;
and wherein:
said array comprises at least one row;
each of said extended gate regions is disposed in a middle position of each of said at least one row;
a space between immediate neighbors of semiconductor pillars of said plurality of vertical transistors is sufficiently narrow except at said middle position and said gate is sufficiently thick such that said plurality of vertical transistors are coupled at said gate except at said middle position;
where said plurality of semiconductor pillars are arranged in said array with at least two rows, a space between said at least two rows is sufficiently wide and said gate film is sufficiently thin such that said plurality of vertical transistors are disconnected at said gate between said at least two rows; and
each of said extended gate regions in each of said at least one row extends horizontally from a bottom edge, but not from a top edge, of said gate of each of two of said plurality of transistors next to said middle position in each of said at least one row.

20. The array of claim 19, wherein said semiconductor pillar of each of said plurality of vertical transistors comprises:
a first region of a first doping type in said middle portion of said semiconductor pillar of each of said plurality of vertical transistors;
a second region of a second doping type occupying a top portion of said semiconductor pillar of each of said plurality of vertical transistors, extending partly into said middle portion from said top portion, and contiguous with said first region; and
a third region of said second doping type occupying said bottom portion of said semiconductor pillar of each of said plurality of vertical transistors, extending partly into said middle portion from said bottom portion, and contiguous with said first region.

21. The array of claim 19, further comprising:
gate bias lines;
gate contacts; and wherein:
each of said gate contacts is disposed on one of said extended gate regions; and
each of said at least one row has one of said gate bias lines coupled to a gate voltage.

22. The array of claim 19, wherein:
said middle position divides each of said at least one row into equal halves.

23. The semiconductor device of claim 19, further comprising:
sharp gate pieces; wherein:
each of said sharp gate pieces is formed vertically in only one of said at least one row where each of said extended gate regions overlaps said gate next to said middle position.

24. A semiconductor device comprising:
a semiconductor substrate containing an electric circuitry formed therein;
interconnect metal lines disposed in said substrate and coupled to said electric circuitry;
a plurality of vertical transistors formed over said substrate;
a gate formed vertically for each said vertical transistors; and
extended gate regions extending horizontally from bottom edges, but not from top edges, of said gates of select some of said vertical transistors such that each of said select some of said vertical transistors has only one of said extended gate regions extending from said gate.

25. The semiconductor device of claim 24, wherein:
said vertical transistors are formed of semiconductor material which is single-crystalline, poly-crystalline, or amorphous.

26. The array of claim 24, wherein:
said gate is formed of semiconductor material, metal, metal alloy, or silicide.

27. The semiconductor device of claim 24, further comprising:
memory cells, volatile or nonvolatile, constructed with at least some of said vertical transistors.

28. The semiconductor device of claim 24, wherein:
said interconnect metal lines are coupled to said vertical transistors.

29. The semiconductor device of claim 24, wherein:
each of said vertical transistors comprises a source region and a drain region; and
select groups of said source or drain regions are commonly coupled within each of said select groups.

30. The semiconductor device of claim 29, further comprising:
memory arrays constructed with at least some of said vertical transistors; wherein:
within each of said select groups, said commonly coupled source or drain regions serve as bit lines for said memory arrays.

31. The semiconductor device of claim 29, further comprising:
conductive lines disposed on said substrate; wherein said commonly coupled source or drain regions are coupled through said conductive lines.

32. The semiconductor device of claim 29, further comprising: a dielectric film between said substrate and said extended gate region of each of said select some of vertical transistors; wherein:

said dielectric film fills spaces between said commonly coupled source or drain regions.

* * * * *